US012622315B2

(12) United States Patent (10) Patent No.: US 12,622,315 B2

Morozumi (45) Date of Patent: May 5, 2026

(54) SEMICONDUCTOR MODULE

(71) Applicant: FUJI ELECTRIC CO., LTD., Kawasaki (JP)

(72) Inventor: Akira Morozumi, Okaya (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 399 days.

(21) Appl. No.: 18/323,157

(22) Filed: May 24, 2023

(65) Prior Publication Data

US 2023/0420318 A1 Dec. 28, 2023

(30) Foreign Application Priority Data

Jun. 28, 2022 (JP) ................................. 2022-103986

(51) Int. Cl.
| | |
|---|---|
| *H01L 23/00* | (2006.01) |
| *H01L 23/053* | (2006.01) |
| *H01L 23/24* | (2006.01) |
| *H01L 23/26* | (2006.01) |
| *H01L 23/498* | (2006.01) |

(52) U.S. Cl.
CPC ........... *H01L 23/24* (2013.01); *H01L 23/053* (2013.01); *H01L 23/26* (2013.01); *H01L 23/49811* (2013.01); *H01L 24/48* (2013.01); *H01L 2224/48227* (2013.01); *H01L 2924/13055* (2013.01); *H01L 2924/164* (2013.01)

(58) Field of Classification Search
CPC ....... H01L 23/24; H01L 23/053; H01L 23/26; H01L 23/49811; H01L 24/48; H01L 2224/48227; H01L 2924/13055; H01L 2924/164; H01L 23/3135; H01L 23/3735; H01L 23/04; H01L 23/10; H01L 23/12; H01L 23/564

See application file for complete search history.

(56) References Cited

U.S. PATENT DOCUMENTS

| | | | |
|---|---|---|---|
| 11,121,004 B2 | 9/2021 | Trichy Rengarajan et al. | |
| 2002/0180019 A1 | 12/2002 | Saito et al. | |
| 2009/0084602 A1 | 4/2009 | Fukuda et al. | |
| 2018/0068918 A1 | 3/2018 | Taya | |
| 2019/0115228 A1 | 4/2019 | Yuasa et al. | |
| 2019/0221449 A1* | 7/2019 | Trichy Rengarajan ..................... H01L 21/54 |

FOREIGN PATENT DOCUMENTS

| | | |
|---|---|---|
| JP | 07-321251 A | 12/1995 |
| JP | 2007-086081 A | 4/2007 |
| JP | 2009-088115 A | 4/2009 |
| JP | 2014-150204 A | 8/2014 |
| WO | 2016/158072 A1 | 10/2016 |
| WO | 2017/188273 A1 | 11/2017 |

* cited by examiner

*Primary Examiner* — Elias Ullah

(57) ABSTRACT

A semiconductor module includes: a mounting substrate including a mounting surface; a semiconductor element disposed on the mounting surface; a housing for the semiconductor element; a lid fixed to the housing and facing the mounting surface; an insulating sealing material disposed in a space inside the housing and sealing the semiconductor element; and a first adsorbent disposed between the lid and the insulating sealing material and is swollen by adsorption.

16 Claims, 16 Drawing Sheets

SEMICONDUCTOR MODULE

CROSS REFERENCE TO RELATED APPLICATION

This Application claims priority from Japanese Patent Application No. 2022-103986, which was filed on Jun. 28, 2022, the entire contents of which are incorporated herein by reference.

BACKGROUND

Field of the Invention

This disclosure relates to semiconductor modules.

Description of Related Art

Proposed is a semiconductor module using a power semiconductor element such as an insulated gate bipolar transistor (IGBT) or a metal-oxide-semiconductor field-effect transistor (MOSFET). For example, JP 2014-150204A, JP H07-321251A, JP 2009-88115A, JP 2007-86081A, and WO 2016/158072A disclose that a semiconductor element is disposed on a mounting substrate and is housed in a frame-shaped housing.

In the semiconductor module, for example, when a substance such as moisture or a corrosive gas (hereinafter referred to as "penetrating substance") enters a space inside the housing, corrosion may occur in a conductor such as wiring electrically connected to the semiconductor element. In addition, when a penetrating substance enters between a sealing material for sealing the semiconductor element and a mounting substrate, a gap is formed between the sealing material and the mounting substrate, which may deteriorate insulation between conductors such as wiring.

SUMMARY

In view of the above circumstances, an object of this disclosure is to suppress entry of a penetrating substance into a semiconductor module.

In order to solve the above problems, a semiconductor module according to one aspect of this disclosure includes: a mounting substrate including a mounting surface; a semiconductor element disposed on the mounting surface; a housing for the semiconductor element; a lid fixed to the housing and facing the mounting surface; an insulating sealing material disposed in a space inside the housing and sealing the semiconductor element; and a first adsorbent disposed between the lid and the insulating sealing material and is swollen by adsorption.

BRIEF DESCRIPTION OF DRAWINGS

FIG. 1 is a cross-sectional view of a semiconductor module according to a first embodiment.

FIG. 3 is an explanatory view of a state in which an adsorbent absorbs a penetrating substance.

FIG. 6 is a cross-sectional view of a semiconductor module according to a third embodiment.

FIG. 10 is a cross-sectional view of a semiconductor module according to a modification.

FIG. 11 is a cross-sectional view of a semiconductor module according to a modification.

FIG. 12 is a cross-sectional view of a semiconductor module according to a modification.

FIG. 13 is a cross-sectional view of a semiconductor module according to a modification.

FIG. 14 is a cross-sectional view of a semiconductor module according to a modification.

FIG. 15 is a cross-sectional view of a semiconductor module according to a modification.

FIG. 17 is a cross-sectional view of a semiconductor module according to a modification.

DESCRIPTION OF EMBODIMENTS

Figure 2:
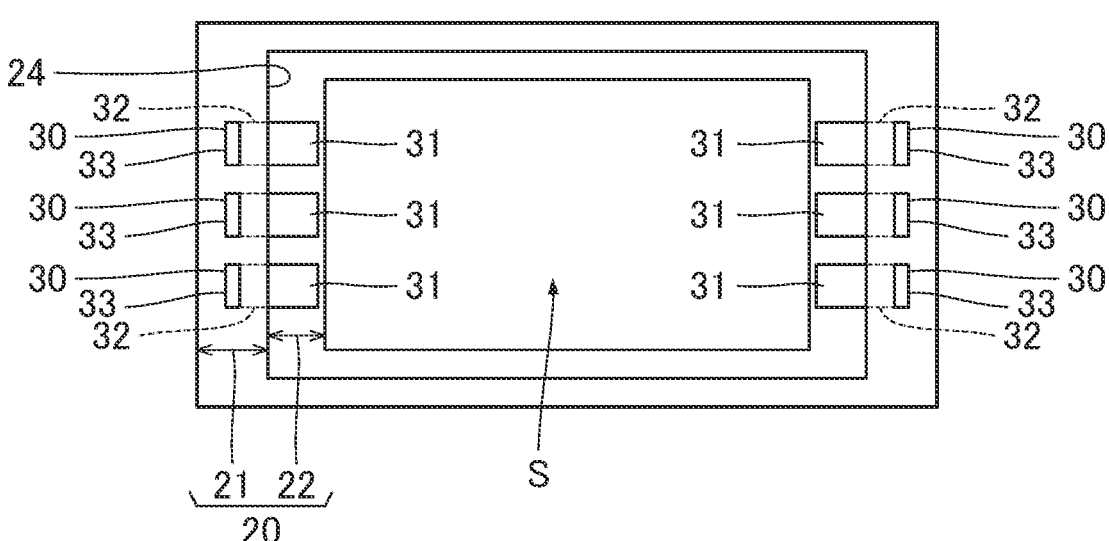
FIG. 2 is a plan view of a housing.

Embodiments for carrying out this disclosure will be described with reference to the drawings. In each drawing, dimensions and scales of each element may be different from those of an actual product. The embodiments described below are exemplary embodiments assumed in a case where this disclosure is implemented. Therefore, the scope of this disclosure is not limited to the following embodiments.

A: First Embodiment

Figure 1:
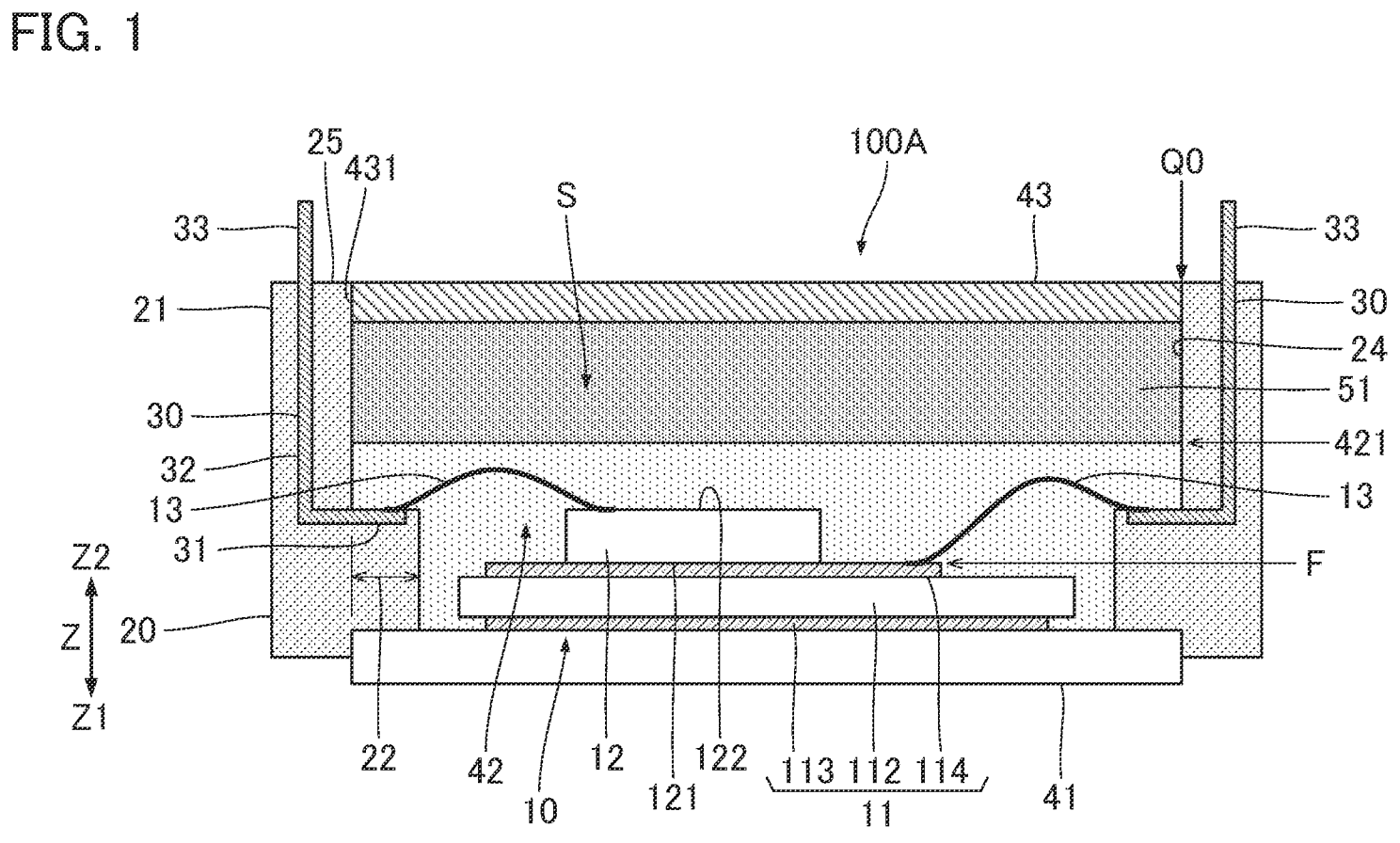

FIG. 1 is a cross-sectional view of a semiconductor module 100A according to a first embodiment. The semiconductor module 100A of the first embodiment is a power semiconductor device constituting a power converter such as an inverter circuit. The semiconductor module 100A includes a semiconductor unit 10, a housing 20, wiring members 30, a heat sink 41, a sealing material 42, a lid 43, and an adsorbent 51.

In the following description, a Z axis is assumed. One direction along the Z axis is referred to as a Z1 direction, and a direction opposite to the Z1 direction is referred to as a Z2 direction. Although the semiconductor module 100A can be disposed in any direction in a state of an actual use, the Z1 direction is downward and the Z2 direction is upward, for the sake of convenience, in the following description. A surface facing the Z1 direction among freely chosen elements of the semiconductor module 100A may be described as a "lower surface", and a surface facing the Z2 direction among the elements may be described as an "upper surface". Viewing an object along the Z axis is referred to as "plan view".

The housing 20 houses the semiconductor unit 10, the heat sink 41, the sealing material 42, the lid 43, and the adsorbent 51, to support them. The housing 20 is formed of various insulating resins, such as a polyphenylene sulfide (PPS) resin, a polybutylene terephthalate (PBT) resin, a poly butylene succinate (PBS) resin, a polyamide (PA) resin, or an acrylonitrile-butadiene-styrene (ABS) resin.

FIG. 2 is a plan view of the housing 20. The housing 20 according to the first embodiment is a rectangular frame in plan view, and includes a side wall 21 and a projecting portion 22. The side wall 21 is a part of the rectangular frame in plan view. The projecting portion 22 is a part of the rectangular frame and projects inward from an inner wall surface 24 of the side wall 21. Hereinafter, the space inside the housing 20 is referred to as "internal space S". The internal space S is surrounded by the housing 20.

The wiring members 30 are leads for electrically connecting the semiconductor unit 10 to an external device (not shown). The wiring members 30 are integrally formed with the housing 20 by insert molding. The housing 20 and the wiring members 30 are provided as a unitary component. The wiring members 30 are power supply lines for the semiconductor unit 10 or control lines for the semiconductor unit 10. For example, the wiring members 30 are formed of a low-resistance conductive material, such as copper or a copper alloy. Independent wiring members 30 may be disposed in the housing 20.

As illustrated in FIGS. 1 and 2, each wiring member 30 includes an internal terminal 31, a coupling portion 32, and an external terminal 33. The internal terminal 31 is one end of the wiring member 30, and the external terminal 33 is the other end of the wiring member 30. The internal terminal 31 is an end portion extending from the inner wall surface 24 of the side wall 21 to the internal space S, and is located on an upper surface of the projecting portion 22. The external terminal 33 is an end portion extending in the Z2 direction from an upper surface (hereinafter referred to as a "terminal surface") 25 of the housing 20 (side wall 21). Thus, the external terminal 33 extends from the housing 20 to a space outside the housing 20. The coupling portion 32 shown in broken lines is coupled with the internal terminal 31 and the external terminal 33, and is embedded in the housing 20. Thus, a perimeter surface of the coupling portion 32 is covered by the housing 20.

The heat sink 41 shown in FIG. 1 is a rectangular plate, supports the semiconductor unit 10, and is formed of a conductive material, such as aluminum or copper. The heat sink 41 dissipates heat generated in the semiconductor unit 10. The heat sink 41 may be used as ground body set to ground potential. The heat sink 41 is fixed to the projecting portion 22 with adhesive. If the semiconductor unit 10 is supported by the housing 20, the heat sink 41 may be omitted.

The semiconductor unit 10 includes a mounting substrate 11, a semiconductor element 12, and wires 13. The mounting substrate 11 is a plate including a mounting surface F. The mounting surface F is an upper surface facing the Z2 direction. Examples of the mounting substrate 11 include a direct copper bonding (DCB) substrate, an active metal brazing (AMB) substrate, and an insulated metal substrate (IMS).

The mounting substrate 11 is formed by laminating an insulating substrate 112, a metal layer 113, and a conductor pattern 114. The insulating substrate 112 is a rectangular plate made of an insulating material. The insulating substrate 112 is made of a ceramic material (e.g., aluminum oxide, aluminum nitride, or silicon nitride), or a resin material (e.g., epoxy resin.) The metal layer 113 is a rectangular plate joined to a lower surface of the insulating substrate 112. The metal layer 113 is formed of a metal material having high thermal conductivity, such as copper or aluminum, and transfers heat generated in the semiconductor unit 10 to the heat sink 41. A lower surface of the metal layer 113 is joined to an upper surface of the heat sink 41.

The conductor pattern 114 is a conductive film on an upper surface of the insulating substrate 112. The conductor pattern 114 is formed of a low-resistance conductive material, such as copper or a copper alloy. The mounting surface F of the mounting substrate 11 corresponds to the conductor pattern 114 and the upper surface of the insulating substrate 112.

The semiconductor element 12 is a power semiconductor chip and is disposed on the mounting substrate 11. Specifically, the semiconductor element 12 is joined to the mounting surface F of the mounting substrate 11 with a conductive joining material, such as solder. Specifically, the semiconductor element 12 is joined to the conductor pattern 114. As illustrated in FIG. 1, the semiconductor element 12 is in housing 20. That is, the semiconductor element 12 is surrounded by the housing 20, and is positioned in the internal space S.

Examples of the semiconductor element 12 include a switching element. such as an insulated gate bipolar transistor (IGBT), or a metal-oxide-semiconductor field-effect transistor (MOSFET), and a diode element, such as a free wheeling diode (FWD). A reverse conducting IGBT (RC-IGBT) including an IGBT and an FWD may be used as the semiconductor element 12. Although one or more semiconductor elements 12 are actually disposed on the mounting substrate 11, only one semiconductor element 12 is illustrated in FIG. 1 for convenience.

The semiconductor element 12 includes an electrode 121 and an electrode 122. The electrode 121 constitutes a lower surface of the semiconductor element 12. The electrode 122 is an electrode constituting an upper surface of the semiconductor element 12. The electrode 121 is a collector electrode or a drain electrode. The electrode 122 is an emitter electrode, a source electrode, or a gate electrode. Joining the semiconductor element 12 to the conductor pattern 114 electrically connects the electrode 121 to the conductor pattern 114.

The electrode 122 of the semiconductor element 12 is electrically connected to the wiring members 30 by, for example, the linear wires 13. One end of the wire 13 is joined to the internal terminal 31 of the wiring member 30, and the other end of the wire 13 is joined to the electrode 122 of the semiconductor element 12. The wiring member 30 is electrically connected to the semiconductor element 12. Some of the wiring members 30 are electrically connected to the conductor pattern 114 by, for example, the wire 13.

The sealing material 42 is an insulator and is disposed in the internal space S of the housing 20, thereby sealing the semiconductor element 12. The sealing material 42 is provided in the internal space S surrounded by the housing 20 with the heat sink 41 as a bottom surface. The semiconductor unit 10 is entirely covered by the sealing material 42. In the first embodiment, the sealing material 42 is gel insulating material, such as silicone gel. As compared with a case in which the sealing material 42 is a hard material, such as an epoxy resin, stress acting on the semiconductor unit 10 from the sealing material 42 can be reduced. However, the specific material of the sealing material 42 may be freely selected, and the sealing material 42 may be a hard material, such as an epoxy resin. In addition, the sealing material 42 may include various fillers, such as silicon oxide or aluminum oxide.

The lid 43 is a plate that closes the internal space S. The lid 43 is fixed to the housing 20 with the opening of the housing 20 (side wall 21) closed. Specifically, the side surface 431 of the lid 43 and the inner wall surface 24 of the housing 20 (side wall 21) are joined with, for example, adhesive, in a state of facing each other. The lid 43 faces the mounting surface F of the mounting substrate 11. The internal space S is surrounded by the housing 20 between the lid 43 and the mounting substrate 11. The semiconductor element 12 is located between the lid 43 and the mounting substrate 11. The lid 43 may be formed of the same type of material as that of the housing 20.

A substance, such as moisture or corrosive gas (hereinafter, "penetrating substance"), is adsorbed onto the adsorbent 51. The adsorbent 51 is a moisture absorbent, such as a water-absorbent polymer or silica gel. Examples of the water-absorbent polymer include sodium polyacrylate. The adsorbent 51 may be freely selected, and it may be granularity or paste.

The adsorbent 51 is disposed between the lid 43 and the sealing material 42. A part of the internal space S, which exists between the sealing material 42 and the lid 43, is filled with the adsorbent 51. For example, the volume of the adsorbent 51 with respect to the volume of the space between the lid 43 and the sealing material 42 is 80% or more (specifically, 90% or more). The volume of the adsorbent 51 related to the volume of the space between the lid 43 and the sealing material 42 is 95% or more (preferably 98% or more). The entire space (100%) between the lid 43 and the sealing material 42 may be filled with the adsorbent 51. The adsorbent 51 comes in contact with the surface 421 of the sealing material 42 and a lower surface of the lid 43. Thus, the sealing material 42 and the adsorbent 51 are filled in between the lid 43 and the mounting substrate 11. The adsorbent 51 is an example of a "first adsorbent".

In the first embodiment, since the adsorbent 51 is disposed between the lid 43 and the sealing material 42, a penetrating substance, which has entered from between the side surface 431 of the lid 43 and the inner wall surface 24 of the housing 20 (shown in FIG. 1 by arrow Q0), is absorbed by the adsorbent 51. That is, the penetrating substance is less likely to reach the semiconductor unit 10. As a result, it is possible to suppress corrosion of each element of the semiconductor unit 10 due to adhesion of a penetrating substance to the element.

Figure 3:
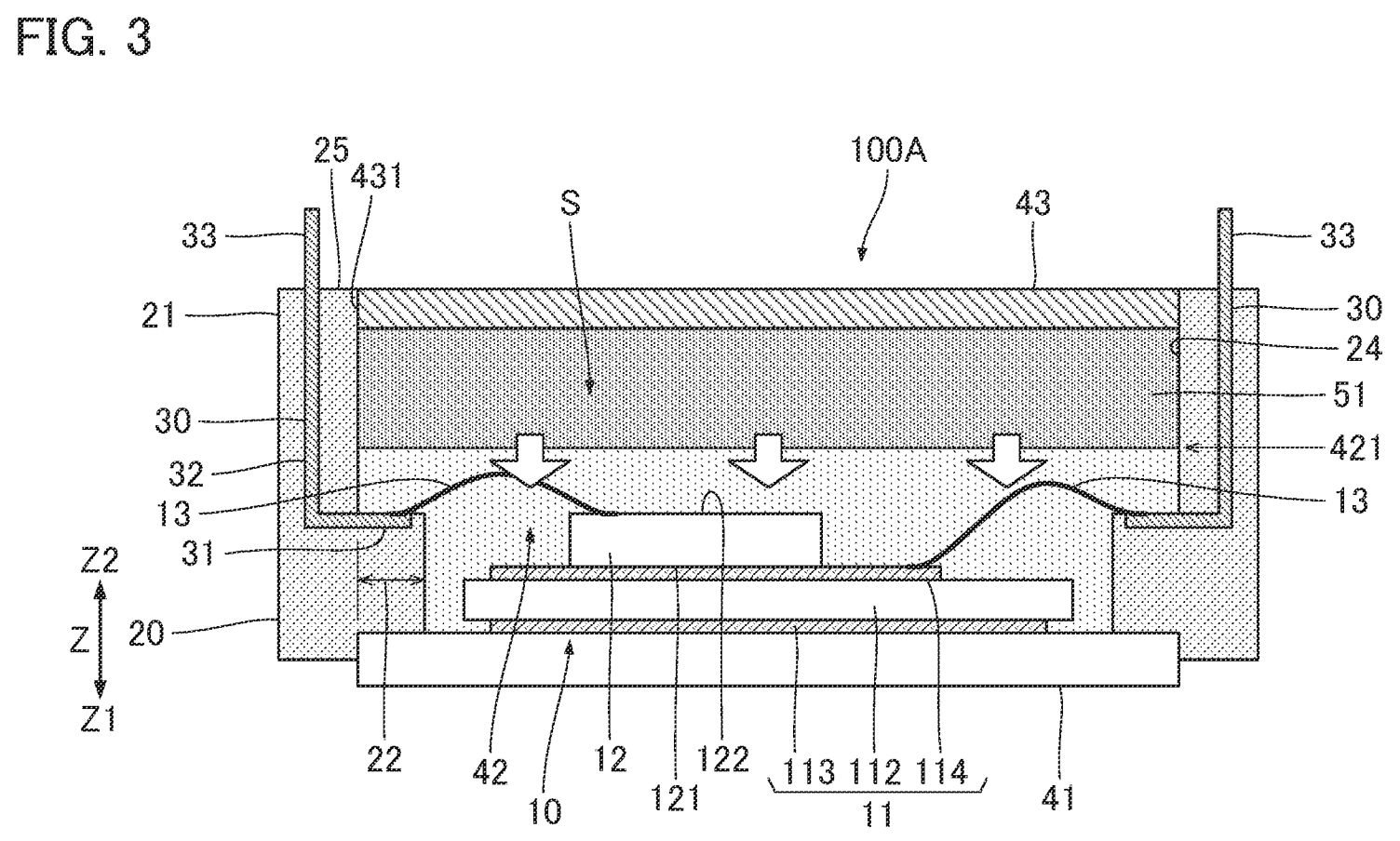

FIG. 3 is an explanatory view of a state in which an adsorbent 51 absorbs a penetrating substance. The adsorbent 51 swells when it adsorbs a penetrating substance such as moisture. In the first embodiment, the adsorbent 51 to be swollen by adsorption is disposed between the lid 43 and the sealing material 42. Since the lid 43 is fixed to the housing 20, the sealing material 42 is pressed by the swollen adsorbent 51 in the Z1 direction as illustrated by arrows in FIG. 3. The adsorbent 51 is an element that is swollen by adsorption to press the sealing material 42. For example, moisture is adsorbed onto the adsorbent 51. Thus, the volume of the adsorbent 51 relative to the volume of the space between the lid 43 and the sealing material 42 is set so that a substance (e.g., moisture or corrosive gas) is adsorbed onto the adsorbent 51 to press the sealing material 42.

A penetrating substance that has entered a gap between the lid 43 and the housing 20 is captured by the adsorbent 51. However, a part of the penetrating substance may reach the sealing material 42 without being absorbed by the adsorbent 51, pass through the sealing material 42, and reach the mounting surface F of the mounting substrate 11. In addition, a penetrating substance entering from between the housing 20 (the projecting portion 22) and the heat sink 41 may reach the mounting surface F of the mounting substrate 11. The penetrating substance that has reached the mounting surface F is vaporized or expanded by being heated by the heat of the semiconductor unit 10.

If no adsorbent 51 is disposed (hereinafter, "Comparative Example A"), the sealing material 42 may peel off from the mounting surface F due to vaporization or expansion of the penetrating substance. This may cause a gap to form between the mounting surface F and the sealing material 42. If a gap is provided between the mounting surface F and the sealing material 42, the elements of the semiconductor unit 10 are close to each other with a short creepage distance interposed between them, which may cause a failure such as discharge or migration between the elements of the semiconductor unit 10. That is, the electrical insulation between the elements of the semiconductor unit 10 may be deteriorated.

In contrast to the comparative example A, in the first embodiment, the adsorbent 51 swells due to adsorption, whereby the sealing material 42 is pressed toward the semiconductor unit 10 (the mounting substrate 11 or the semiconductor element 12). This means that a gap is less likely to form between the mounting substrate 11 and the sealing material 42. As a result, the first embodiment can suppress a decrease in insulating properties due to the gap between the mounting surface F and the sealing material 42, as compared with the Comparative Example A.

FIG. 23 of WO 2016/158072 A discloses that a pressing plate that covers a silicone gel is pressed by a spring. In contrast, in the first embodiment, the adsorbent 51 for absorbing a penetrating substance is also used for pressing the sealing material 42. As a result, the configuration of the semiconductor module 100A is simple, as compared with a case in which the sealing material 42 is pressed by an independent mechanism from the adsorbent 51 (e.g., an elastic body, such as a spring).

The gel soft resin material tends to easily permeate a penetrating substance, as compared with a hard resin, such as an epoxy resin. According to the first embodiment, the adsorbent 51 between the lid 43 and the sealing material 42 prevents a penetrating substance from reaching the sealing material 42. When the sealing material 42 is a gel insulating material, the first embodiment, in which the adsorbent 51 is disposed between the lid 43 and the sealing material 42, is particularly effective.

B: Second Embodiment

A second embodiment of this disclosure will be described. In the embodiments described below, like reference signs are used for elements that have functions or effects that are the same as those of elements described in the first embodiment, and detailed explanation of such elements is omitted as appropriate.

Figure 4:
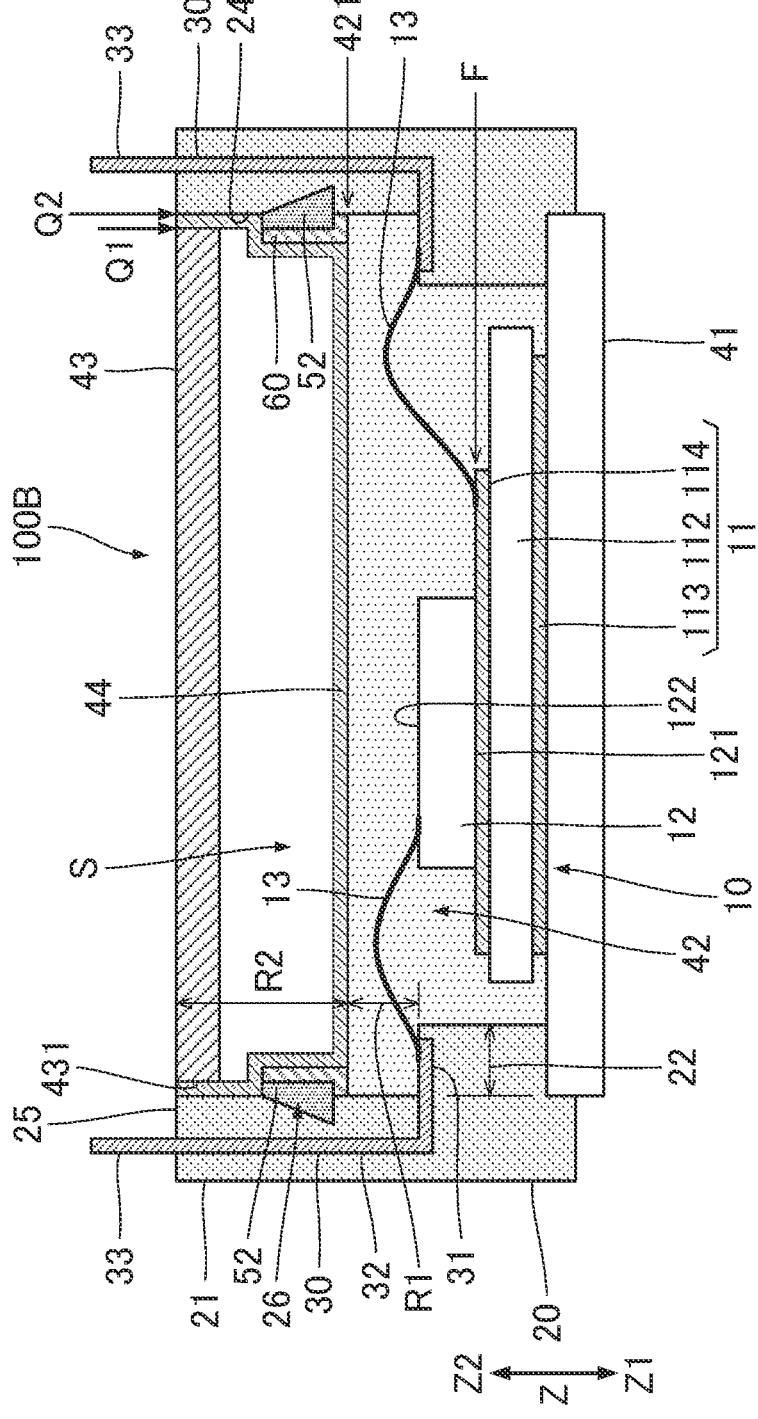
FIG. 4 is a cross-sectional view of a semiconductor module according to a second embodiment.

FIG. 4 is a cross-sectional view of a semiconductor module 100B according to a second embodiment. The semiconductor module 100B includes a semiconductor unit 10, a housing 20, wiring members 30, a heat sink 41, a sealing material 42, a lid 43, and a protective film 44. The semiconductor unit 10, the wiring members 30, the heat sink 41, the sealing material 42, and the lid 43 are similar to those of the first embodiment, and thus detailed description thereof is omitted. In the second embodiment, the semiconductor module 100B includes no adsorbent 51 shown in the first embodiment.

The inner wall surface 24 of the housing 20 is divided into a first region R1 and a second region R2 along the Z axis. The first region R1 is a region of the inner wall surface 24 that comes in contact with the sealing material 42. The second region R2 is a region of the inner wall surface 24 that does not come in contact with the sealing material 42. That is, the first region R1 is a region of the inner wall surface 24 located in the Z1 direction related to the surface 421 of the sealing material 42. The second region R2 is a region of the inner wall surface 24 located in the Z2 direction related to the surface 421. The first region R1 is located in the Z1 direction related to the second region R2. The first region R1 may include not only a part of the inner wall surface 24 of the side wall 21 but also an inner wall surface of the projecting portion 22 (a region reaching the surface of the heat sink 41).

Figure 5:
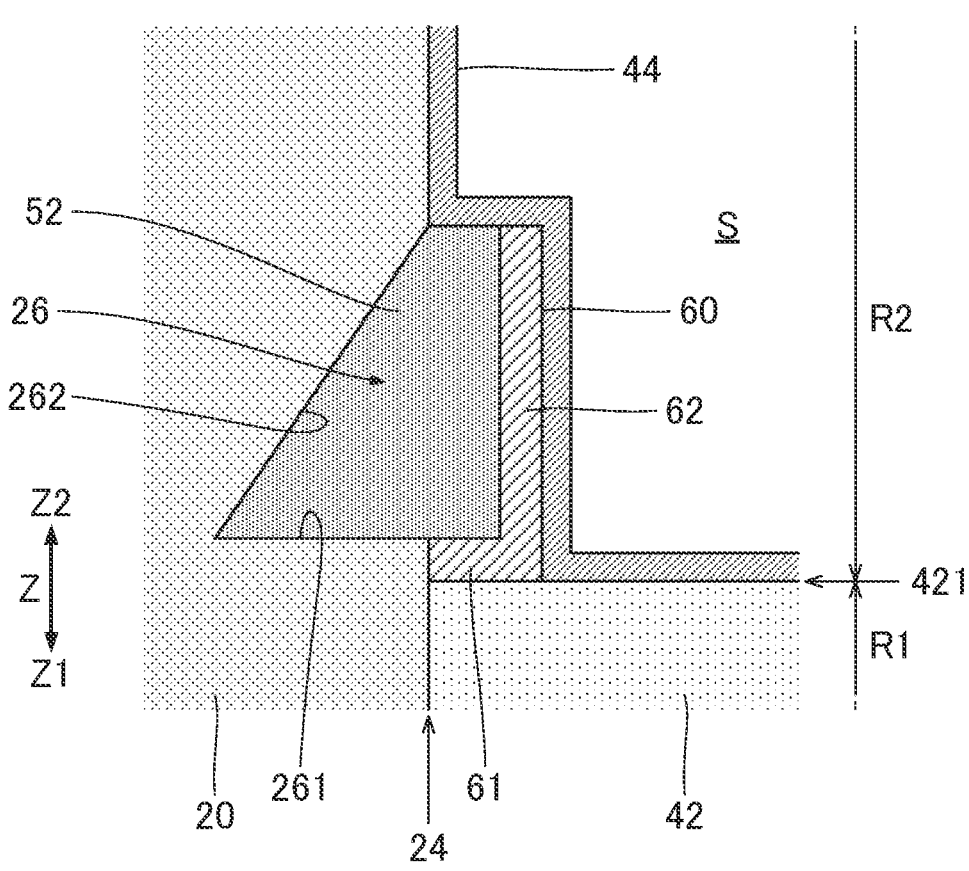
FIG. 5 is an enlarged cross-sectional view of the vicinity of an accommodating portion.

In the second embodiment, an accommodating portion 26 is provided in the inner wall surface 24 of the housing 20. The accommodating portion 26 is a groove that is recessed from the inner wall surface 24. FIG. 5 is an enlarged cross-sectional view of the vicinity of the accommodating portion 26. The accommodating portion 26 is provided in the second region R2. Specifically, the accommodating portion 26 is positioned between the sealing material 42 and the lid 43. The accommodating portion 26 extends in the direction orthogonal to the Z axis on the inner wall surface 24 and is continuous over the entire perimeter of the housing 20.

As illustrated in FIG. 5, the accommodating portion 26 is a space defined by a first surface 261 and a second surface 262. The first surface 261 is a plane orthogonal to the Z axis and faces the Z2 direction. The second surface 262 is a plane inclined at an acute angle with respect to the first surface 261. The accommodating portion 26 is triangular in cross-section.

A protrusion 60 is disposed in the housing 20. The protrusion 60 extends from the inner wall surface 24 of the housing 20 to the inside of the housing 20 (internal space S). The protrusion 60 extends in the direction orthogonal to the Z axis on the inner wall surface 24 and is continuous over the entire perimeter of the housing 20. For example, an independent protrusion 60 is joined to the inner wall surface 24 of the housing 20 with adhesive. The protrusion 60 may be fitted or press-fitted into the housing 20 without using adhesive. The protrusion 60 may be unitary with the housing 20. That is, the protrusion 60 is a part of the housing 20.

As illustrated in FIG. 5, the protrusion 60 includes a first portion 61 and a second portion 62. The first portion 61 protrudes from the inner wall surface 24 of the housing 20. Specifically, the first portion 61 protrudes in a direction orthogonal to the Z axis from a region of the inner wall surface 24 between the first region R1 and the accommodating portion 26. Specifically, the first surface 261 of the accommodating portion 26 and an upper surface of the first portion 61 are continuous without a step. That is, the first surface 261 of the accommodating portion 26 and the upper surface of the first portion 61 are located in the same plane. However, a step may be provided between the first surface 261 of the accommodating portion 26 and the upper surface of the first portion 61. In FIGS. 4 and 5, the positions in the Z axis of a lower surface of the first portion 61 and the surface 421 of the sealing material 42 coincide with each other, but the positions in the Z axis of the lower surface of the first portion 61 and the surface 421 of the sealing material 42 may be different from each other.

The second portion 62 extends in the Z2 direction from the distal end of the first portion 61 along the inner wall surface 24. The upper end of the second portion 62 is positioned in the Z2 direction with respect to the surface 421 of the sealing material 42. Specifically, the upper end of the second portion 62 is located at the same height as the upper end of the second surface 262 in the accommodating portion 26. As a result, the second portion 62 faces the accommodating portion 26. The protrusion 60 protrudes from the region between the first region R1 and the accommodating portion 26 on the inner wall surface 24 of the housing 20.

As is clear from the description, provided is a space (hereinafter referred to as "adsorption space") surrounded by the first surface 261 and the second surface 262 of the accommodating portion 26 and the first portion 61 and the second portion 62 of the protrusion 60. The accommodating portion 26 and the protrusion 60 are continuous over the entire perimeter of the housing 20. For this reason, the adsorption space extends in the direction orthogonal to the Z axis and is continuous over the entire perimeter of the housing 20.

An adsorbent 52 is accommodated in the accommodating portion 26. Specifically, the adsorbent 52 is accommodated in the adsorption space defined by the accommodating portion 26 and the protrusion 60. The adsorbent 52 accommodated in the accommodating portion 26 is dammed by the protrusion 60 (second portion 62). That is, the protrusion 60 acts as an element for holding the adsorbent 52 in the accommodating portion 26.

As with the adsorbent 51 of the first embodiment, the adsorbent 52 is a granular or paste-like composition, by which a penetrating substance is adsorbed. For example, a water-absorbent polymer or silica gel is used as the adsorbent 52. The adsorbent 52 is disposed in the accommodating portion 26 by an injection mechanism, such as a dispenser. The adsorption space is continuous over the entire perimeter of the housing 20. As a result, the adsorbent 52 in the adsorption space is also continuous over the entire perimeter of the housing 20. The adsorbent 52 is an example of a "second adsorbent".

As illustrated in FIGS. 4 and 5, the protective film 44 covers the inner wall surface 24 of the housing 20 and the surface 421 of the sealing material 42. Specifically, the protective film 44 covers the second region R2 of the inner wall surface 24, a surface of the protrusion 60, and the surface 421 of the sealing material 42. The protective film 44 is formed of a material having low permeability to a penetrating substance. For example, a film formed of a fluoroesin such as polytetrafluoroethylene (PTFE) or ethylene-tetrafluoroethylene (ETFE) is used as the protective film 44. In addition, the protective film 44 may be formed of a resin material, such as polyimide. The protective film 44 may be formed by laminating layers formed of different materials.

The protective film 44 is formed by joining a film manufactured in advance to the inner wall surface 24 of the housing 20 and the surface 421 of the sealing material 42, in a state in which the film is deformed into a shape along the inner wall surface 24 of the housing 20 and the surface 421 of the sealing material 42. In addition, the protective film 44 may be formed by applying and curing a resin material on the inner wall surface 24 of the housing 20 and the surface 421 of the sealing material 42.

The inner wall surface 24 of the housing 20 and the side surface 431 of the lid 43 face each other. As illustrated in FIG. 4, the protective film 44 includes a portion positioned between the inner wall surface 24 of the housing 20 and the side surface 431 of the lid 43. Specifically, the portion of the protective film 44 including the end portion in the Z2 direction is sandwiched between the inner wall surface 24 of the housing 20 and the side surface 431 of the lid 43. According to this configuration, as compared with a case in which the protective film 44 is not interposed between the inner wall surface 24 and the side surface 431, a penetrating substance is less likely to enter the interior of the housing 20 from a gap between the inner wall surface 24 of the housing 20 and the side surface 431 of the lid 43.

In the second embodiment, the inner wall surface 24 of the housing 20 and the surface 421 of the sealing material 42 are covered with the protective film 44. As a result, a penetrating substance (shown by arrow Q1 in FIG. 4) that has entered a gap between the protective film 44 and the lid 43 is blocked by the protective film 44, and no penetrating substance reaches the sealing material 42. Adhesion of a penetrating substance to the sealing material 42 is prevented.

The adsorbent 52 is disposed in the accommodating portion 26 in the inner wall surface 24 of the housing 20. In this configuration, a penetrating substance (shown by arrow Q2 in FIG. 4), which has entered a gap between the protective film 44 and the inner wall surface 24 of the housing 20, is absorbed by the adsorbent 52. As a result, such a penetrating substance is less likely to reach the sealing material 42.

In the second embodiment, it is possible to suppress adhesion of a penetrating substance that entered from a gap between the protective film 44 and the lid 43 to the sealing material 42. In addition, it is possible to suppress adhesion of a penetrating substance entered from a gap between the protective film 44 and the inner wall surface 24 of the housing 20 to the sealing material 42. The adhesion of the penetrating substance to the sealing material 42 is effectively suppressed, which reduces the probability that a penetrating substance that has passed through the sealing material 42 will adhere to the semiconductor unit 10. As a result, it is possible to suppress corrosion of each element of the semiconductor unit 10 due to adhesion of a penetrating substance to the element. Furthermore, suppressing the entry of the penetrating substance prevents the sealing material 42 from peeling off from the mounting surface F due to vaporization or expansion of the penetrating substance. This leads to suppression of a decrease in electrical insulation between the elements of the conductor unit. That is, it is possible to reduce risk of a failure such as discharge or migration between the elements of the semiconductor unit 10.

In the second embodiment, in particular, the accommodating portion 26 that accommodates the adsorbent 52 is continuous over the entire perimeter of the housing 20. This can prevent a penetrating substance, which has entered between the inner wall surface 24 of the housing 20 and the protective film 44, from reaching the sealing material 42 over the entire perimeter of the housing 20. However, a configuration in which the accommodating portion 26 is continuous over the entire perimeter of the housing 20 may be omitted.

In the second embodiment, the protrusion 60 is provided on the inner wall surface 24 of the housing 20. As compared with a case of no provision of the protrusion 60, a path length of propagation of a penetrating substance shown by arrow Q increases. Here, the path length represents a path through which the penetrating substance enters a gap between the protective film 44 and the inner wall surface 24 and propagates until it reaches the sealing material 42. This can effectively prevent such a penetrating substance (shown by arrow Q2) from reaching the sealing material 42. In particular, in the second embodiment, since the protrusion 60 includes the first portion 61 and the second portion 62, it is possible to sufficiently secure the path length described above, as compared with a case in which the protrusion 60 includes only the first portion 61. Furthermore, since the second portion 62 of the protrusion 60 faces the accommodating portion 26, the adsorbent 52 accommodated in the accommodating portion 26 can be held in the accommodating portion 26 by the second portion 62. That is, the protrusion 60 is used both to secure the path length of the penetrating substance and to hold the adsorbent 52.

C: Third Embodiment

Figure 6:
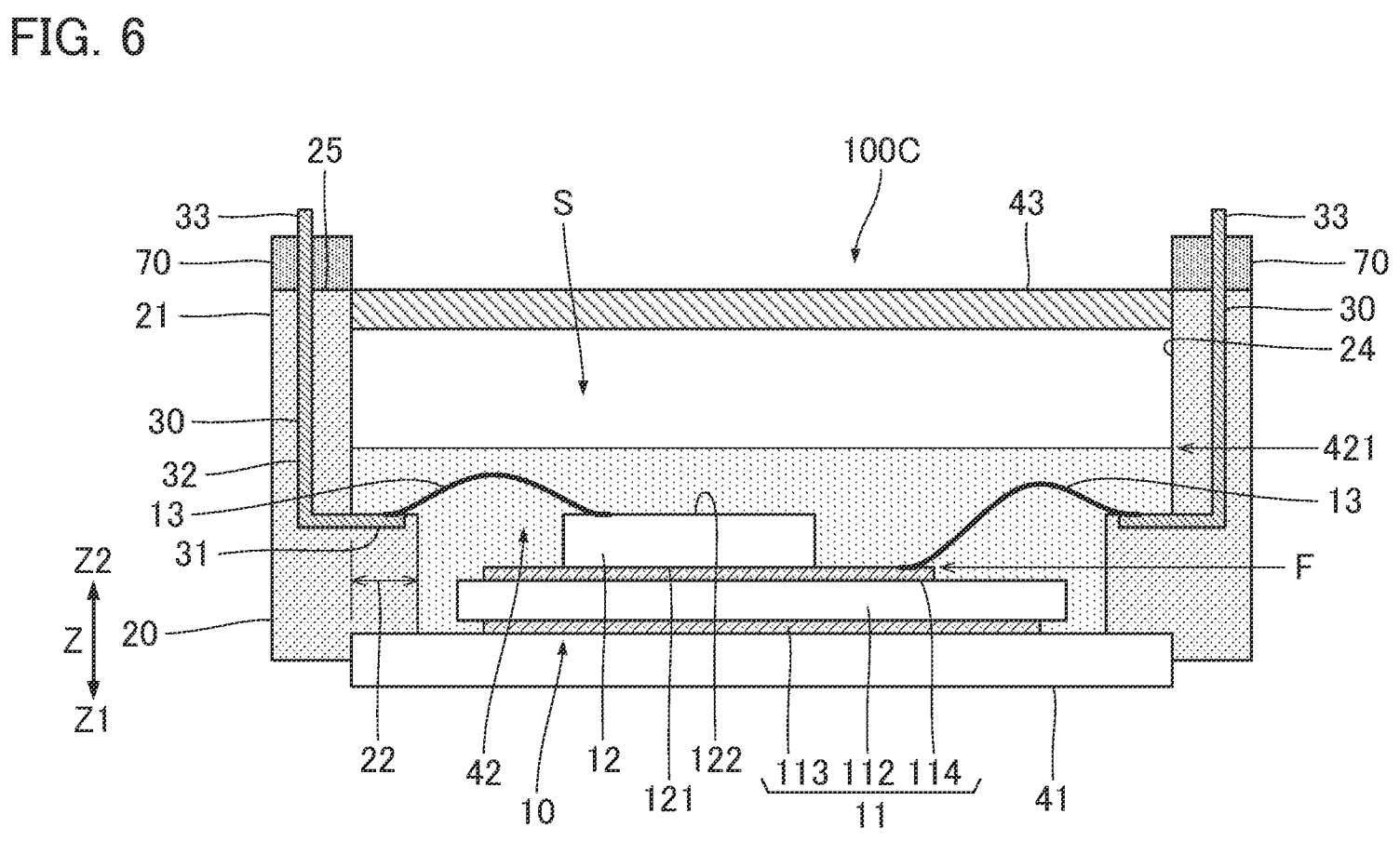

FIG. 6 is a cross-sectional view of a semiconductor module 100C according to a third embodiment. The semiconductor module 100C includes a semiconductor unit 10, a housing 20, wiring members 30, a heat sink 41, a sealing material 42, a lid 43, and a protector 70. The semiconductor unit 10, the housing 20, the wiring members 30, the heat sink 41, the sealing material 42, and the lid 43 are similar to those of the first embodiment, and thus detailed description of them is omitted. In the third embodiment, the semiconductor module 100C includes nether the adsorbent 51 according to the first embodiment nor the adsorbent 52 according to the second embodiment.

The protector 70 is a single component that is independent from the housing 20. For example, the protector 70 is formed independently from the housing 20 by injection molding using a mold. The protector 70 is joined to the housing 20 with adhesive. Specifically, the protector 70 is joined to the terminal surface 25 of the housing 20 and covers the external terminal 33 in each of the wiring members 30. That is, the protector 70 covers the gap between the external terminal 33 and the terminal surface 25.

This configuration can prevent a penetrating substance from entering the internal space S of the housing 20 from the gap between the housing 20 and the external terminal 33. That is, the penetrating substance is less likely to reach the semiconductor unit 10. This leads to suppress corrosion of each element of the semiconductor unit 10 due to adhesion of a penetrating substance to the element. In addition, suppressing the entry of the penetrating substance reduces the probability that the sealing material 42 will be peeled off from the mounting surface F due to vaporization or expansion of the penetrating substance. This leads to suppress a decrease in electrical insulation between the elements of the conductor unit. That is, it is possible to reduce a failure such as discharge or migration between the elements of the semiconductor unit 10.

The protector 70 may be formed by applying a resin material to the terminal surface 25 of the housing 20 and cure the applied resin material (hereinafter, "comparative example B"). In this regard, JP 2007-86081 A discloses that a gap between a lead terminal extending from a side surface of a container and the container is covered with a polyimide resin. In contrast, in the third embodiment, the protector 70 is a single component, whereby it is easy to dispose the protector 70 in the housing 20. In the comparative example B, in some cases, the protector 70 may be peeled off from the terminal surface 25 of the housing 20. According to the third embodiment, the protector 70 is a single component. As a result, the protector 70 is less likely to be peeled off from the housing 20, as compared with the comparative example B. A penetrating substance is less likely to enter the interior of the housing 20 from the gap between the housing 20 and the external terminal 33.

The protector 70 is formed of a variety of insulating materials, such as a PPS resin, a PBT resin, a PBS resin, a PA resin, or an ABS resin. For example, the protector 70 is formed of the same type of material to the housing 20. This means that the linear expansion coefficients of the protector 70 and the housing 20 are substantially identical to each other. According to this configuration, the thermal stress caused by the difference in linear expansion coefficient between the protector 70 and the housing 20 is reduced, as compared with a case in which the protector 70 and the housing 20 are formed of different materials. As a result, a gap is less likely to form between the protector 70 and the housing 20, which makes it possible to suppress entry of a penetrating substance through the gap. However, the material of the protector 70 is freely selected, and the protector may be formed of a material different from that of the housing 20.

Figure 7:
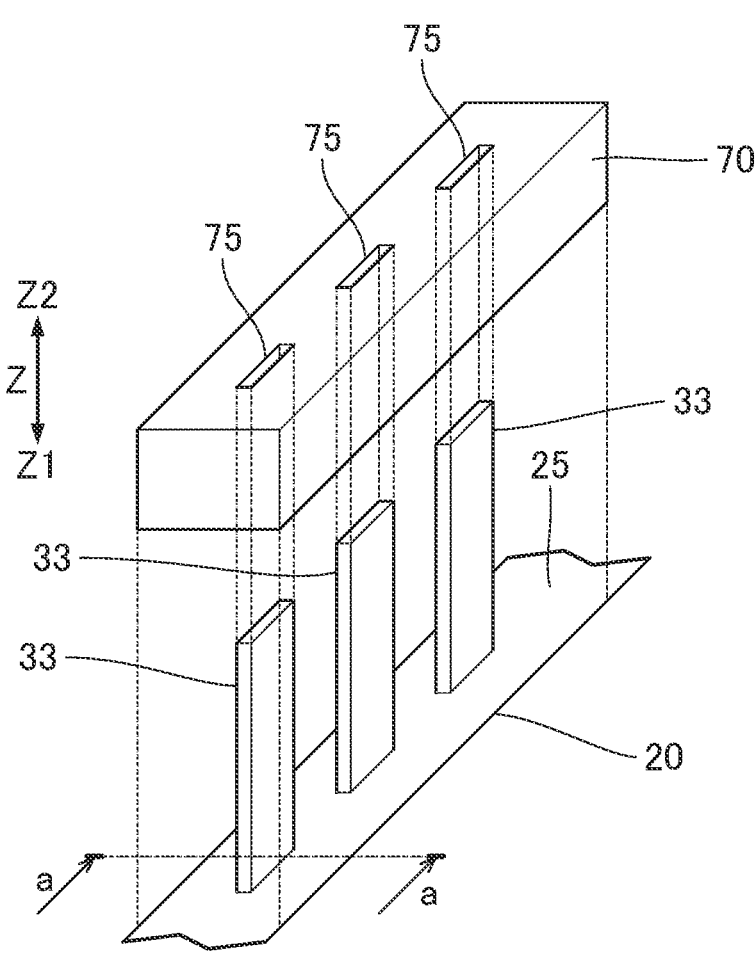
FIG. 7 is an enlarged exploded perspective view of the vicinity of a protector.
Figure 8:
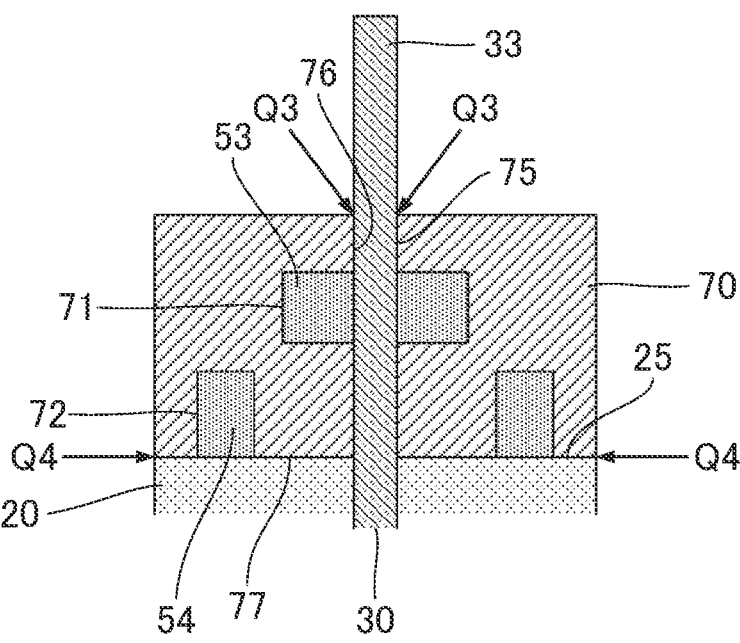
FIG. 8 is a cross-sectional view taken along line a-a in FIG. 7.

FIG. 7 is an enlarged exploded perspective view of the vicinity of the protector 70 in the semiconductor module 100C. FIG. 8 is a cross-sectional view taken along line a-a in FIG. 7. As illustrated in FIG. 7, the external terminals 33 of wiring members 30 extend from the terminal surface 25 of the housing 20 in the Z2 direction. The external terminals 33 are arranged at intervals.

Plural insertion openings 75, each corresponding to a different external terminal 33, are provided in the protector 70. Each insertion opening is rectangular in cross section and corresponds to the cross section of the external terminal 33. The protector 70 is fixed to the housing 20 with each external terminal 33 inserted into the insertion opening 75. As is clear from FIG. 7, in the third embodiment, the protector 70 is a unitary member that covers the external terminals 33 in the wiring members 30. That is, the external terminals 33 are collectively covered with the single protector 70. As a result, the configuration of the semiconductor module 100C can be simple, as compared with a case in which the external terminal 33 of each of the wiring members 30 is covered with the individual protector 70 (shown in FIG. 16). For example, the number of parts is reduced, and the manufacturing process is simplified.

As illustrated in FIG. 8, the protector 70 includes an inner perimeter surface 76 and a joint surface 77. The inner perimeter surface 76 is an inner surface of the insertion opening 75. That is, the inner perimeter surface 76 is an inner surface of the protector 70 facing the external terminal 33. The inner perimeter surface 76 comes in contact with the external terminal 33 without any gap between them. The joint surface 77 corresponds to a lower surface of the protector 70. That is, the joint surface 77 is an inner surface of the protector 70 facing the housing 20. The joint surface 77 is joined to the terminal surface 25 of the housing 20 using, for example, an adhesive.

Figure 9:
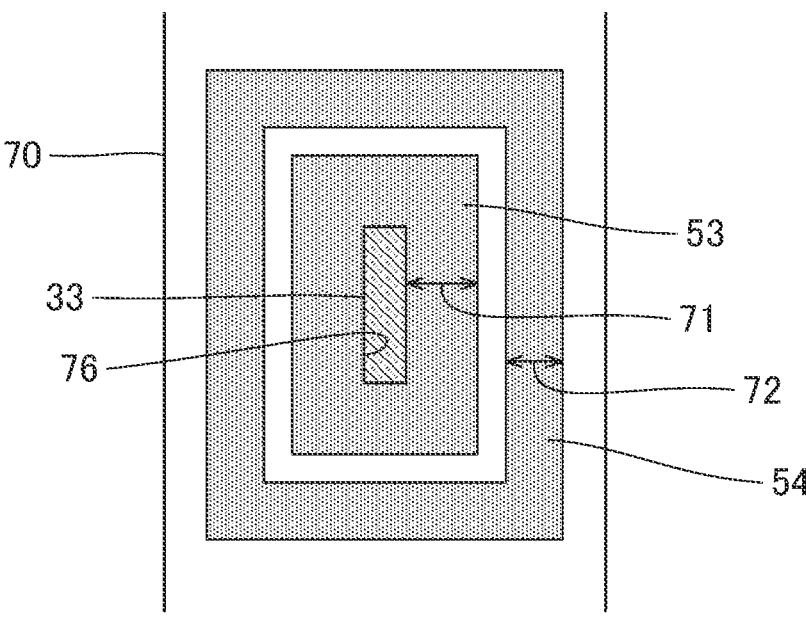
FIG. 9 is a plan view of a first groove and a second groove.

A first groove 71 is provided in the inner perimeter surface 76 of the protector 70. The first groove 71 is recessed from the inner perimeter surface 76. As illustrated in FIG. 9, the first groove 71 is continuous over the entire perimeter of the inner perimeter surface 76. Specifically, the first groove 71 is formed in a rectangular frame shape in plan view. That is, the first groove 71 surrounds the external terminal 33 over the entire perimeter on the inner perimeter surface 76 of the insertion opening 75 into which the external terminal 33 is inserted.

As illustrated in FIGS. 8 and 9, the adsorbent 53 is accommodated in the first groove 71 of the protector 70. Specifically, the adsorbent 53 is accommodated in a space defined by the inner surface of the first groove 71 and the side surface of the external terminal 33. The adsorbent 53 comes in contact with the external terminal 33. As with the adsorbent 51 of the first embodiment, the adsorbent 53 is a granular or paste composition. A penetrating substance is adsorbed onto the adsorbent 53. For example, a water-absorbent polymer or silica gel is used as the adsorbent 53. The first groove 71 is continuous over the entire perimeter of the external terminal 33. As a result, the adsorbent 53 in the first groove 71 is disposed so as to surround the external terminal 33 over the entire perimeter. The adsorbent 53 is an example of a "third adsorbent".

In this configuration, a penetrating substance (arrow Q3 in FIG. 8) that has entered a gap between the protector 70 and the external terminal 33 is absorbed by the adsorbent 53. This can effectively prevent a penetrating substance that has entered a gap between the protector 70 and the external terminal 33, from reaching the internal space S of the housing 20. In the third embodiment, in particular, the first groove 71 surrounds the entire perimeter of the external terminal 33. As compared with a case in which the first groove 71 surrounds only a part of the external terminal 33, the entry of a penetrating substance is remarkably reduced. However, a form in which the first groove 71 surrounds only a part of the external terminal 33 is also assumed.

A second groove 72 is provided in the joint surface 77 of the protector 70. The second groove 72 is recessed from the joint surface 77. The second grooves 72 are separately formed for the respective external terminals 33. As illustrated in FIG. 9, the second groove 72 is formed in a rectangular frame shape surrounding the external terminal 33 in plan view. The second groove 72 surrounds the entire perimeter of the external terminal 33 on the joint surface 77.

An adsorbent 54 is accommodated in the second groove 72 of the protector 70. Specifically, the adsorbent 54 is accommodated in a space defined by the inner surface of the second groove 72 and the terminal surface 25 of the housing 20. The adsorbent 54 comes in contact with the terminal surface 25. As with the adsorbent 51 according to the first embodiment, the adsorbent 54 is a granular or paste composition. A penetrating substance is adsorbed onto the adsorbent 54. For example, a water-absorbent polymer or silica gel is used as the adsorbent 54. As described above, the second groove 72 surrounds the entire perimeter of the external terminal 33. As a result, the adsorbent 54 in the second groove 72 is disposed so as to surround the external terminal 33 over the entire perimeter. The adsorbent 54 is an example of a "fourth adsorbent".

In this configuration, a penetrating substance (arrow Q4 in FIG. 8) that has entered a gap between the protector 70 and the housing 20 is adsorbed onto the adsorbent 54. This can effectively prevent penetrating substance that has entered a space between the protector 70 and the housing 20, from reaching the internal space S of the housing 20. In the third embodiment, in particular, the second groove 72 surrounds the entire perimeter of the external terminal 33. As a result, as compared with a case in which the second groove 72 surrounds only a part of the external terminal 33, the entry of a penetrating substance is remarkably reduced. However, it is not excluded that the second groove 72 surrounds only a part of the external terminal 33.

D: Modifications

Specific modifications applicable to each of the aspects described above are set out below. Two or more modes selected from the following descriptions may be combined with one another as appropriate as long as such combination does not give rise to any conflict.

(1) The foregoing embodiments describe the following examples.

(i) Configuration 1 (First Embodiment)

The adsorbent 51 disposed between the lid 43 and the sealing material 42 is swollen by liquid adsorption to press the sealing material 42.

13

14

(ii) Configuration 2 (Second Embodiment)

The adsorbent 52 is accommodated in the accommodating portion 26 formed in the inner wall surface 24 of the housing 20, and the inner wall surface 24 of the housing 20 and the surface 421 of the sealing material 42 are covered with the protective film 44.

(iii) Configuration 3 (Third Embodiment)

The external terminal 33 is covered with the protector 70 that is a single component.

Figure 10:
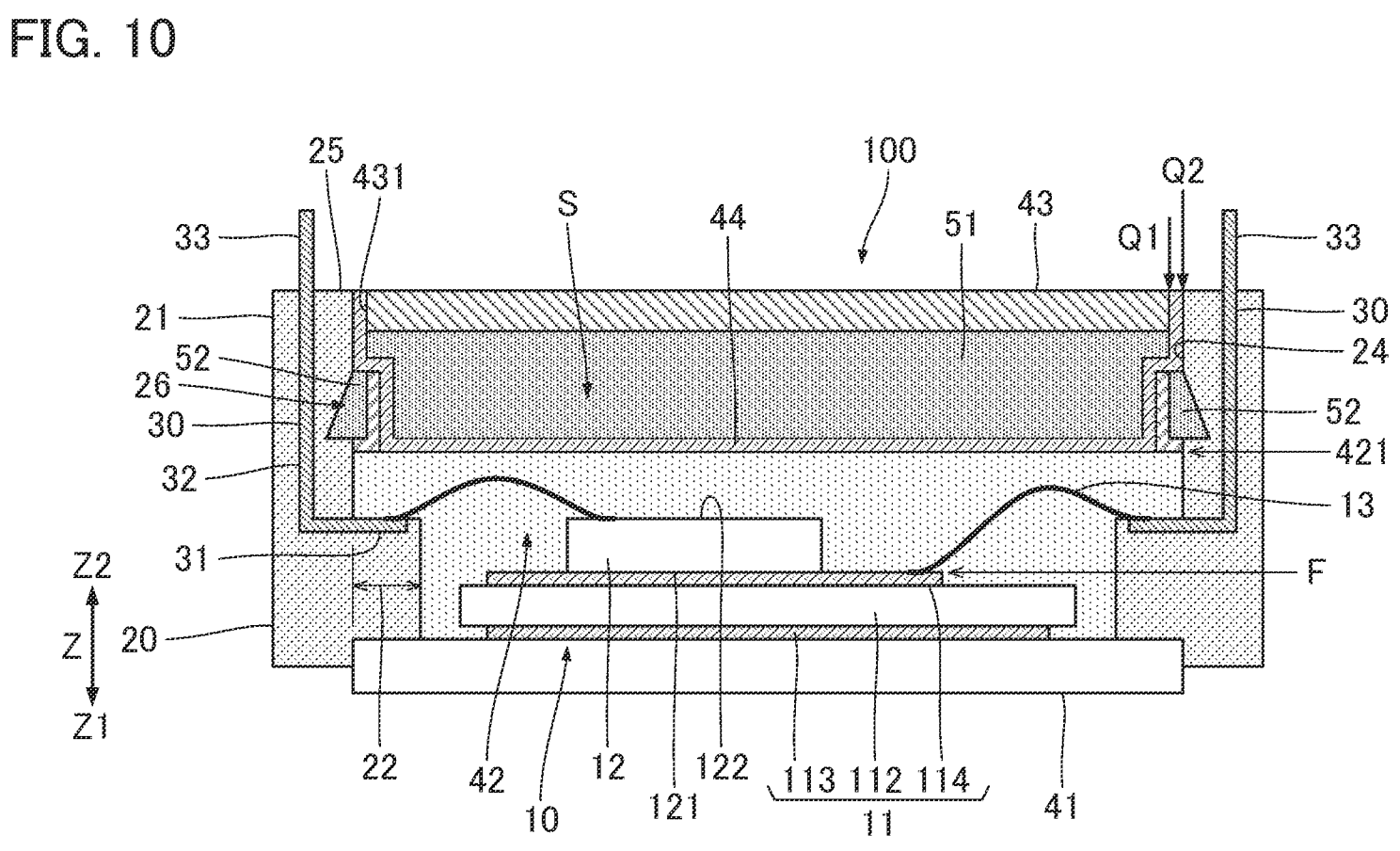

Two or more configurations selected from the configurations 1 to 3 may be combined. FIG. 10 illustrates an example of a combination of the configurations 1 and 2. In FIG. 10, the adsorbent 51 is disposed in a space surrounded by the protective film 44 and the lid 43. When a substance, such as moisture or corrosive gas, is adsorbed onto the adsorbent 51, the protective film 44 and the sealing material 42 are pressed in the Z1 direction by swelling of the adsorbent 51. In FIG. 10 and subsequent drawings, the reference numerals of the semiconductor modules are unified as "100" for the sake of convenience.

Figure 11:
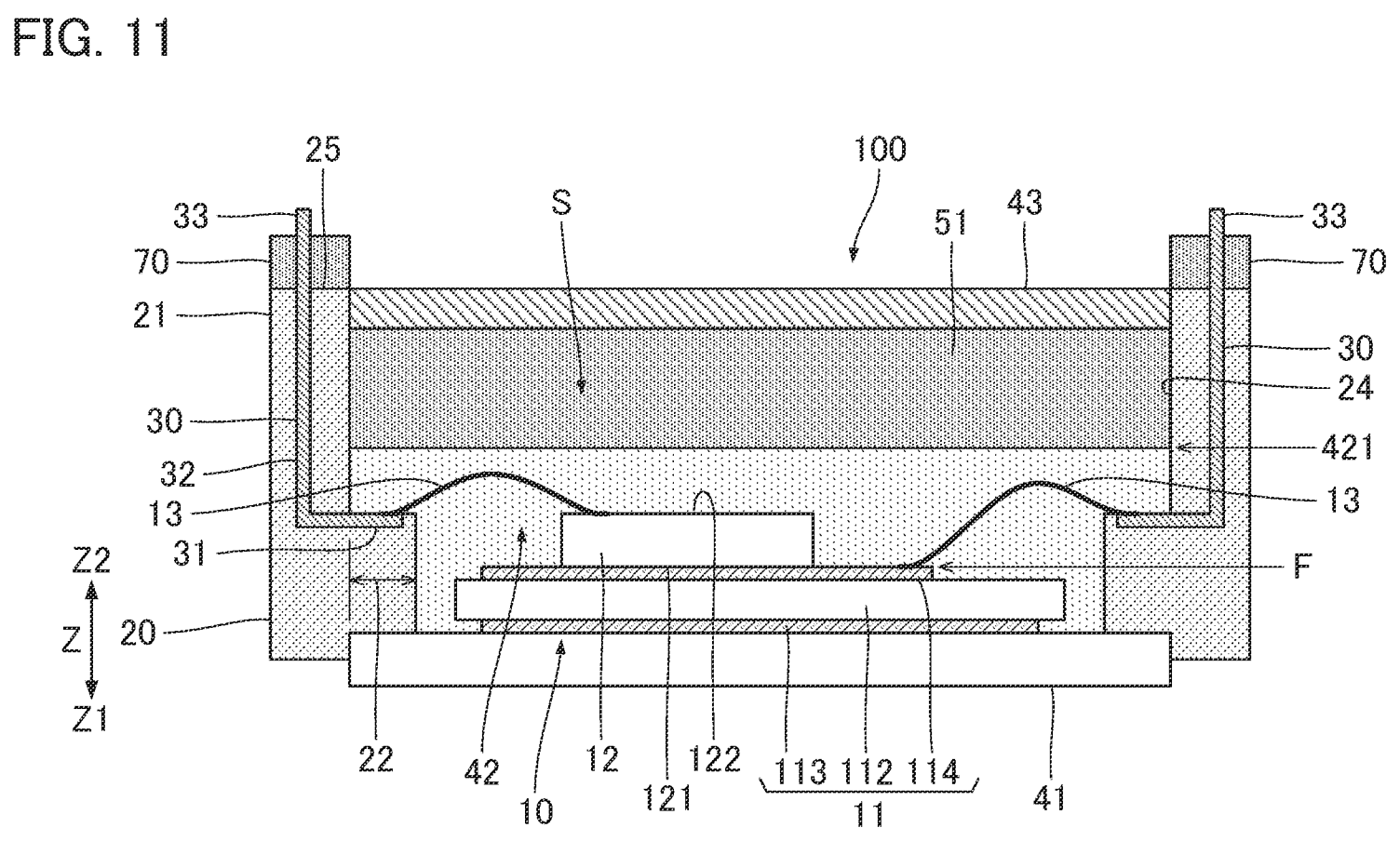

FIG. 11 illustrates an example of combination of the configurations 1 and 3. When a substance, such as moisture or corrosive gas, is adsorbed onto the adsorbent 51, the adsorbent 51 is swollen. As a result, the sealing material 42 is pressed by swelling of the adsorbent 51, and the external terminals 33 is covered by the protector 70.

Figure 12:
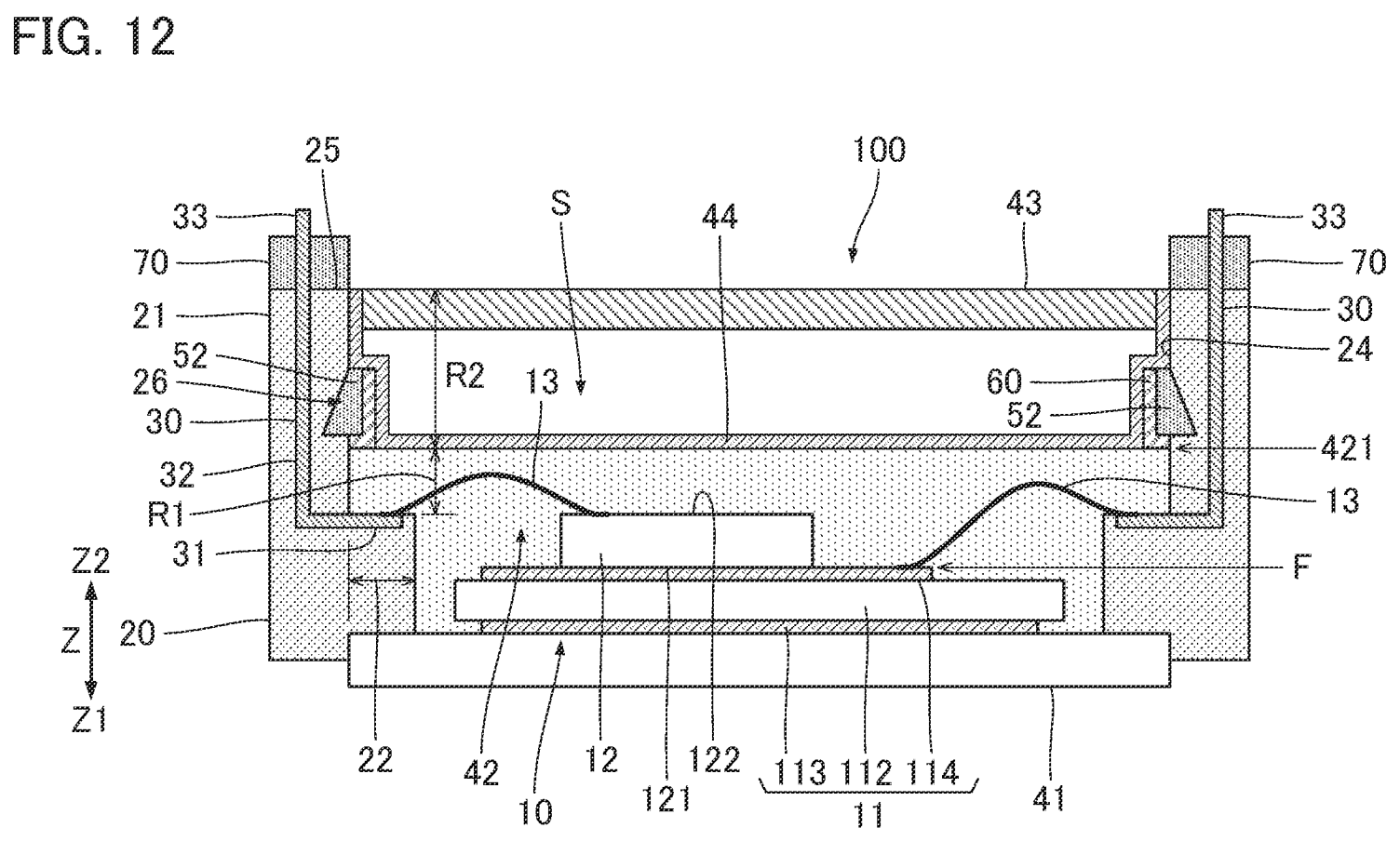

FIG. 12 illustrates an example of a combination of the configurations 2 and 3. Specifically, the adsorbent 52 in the accommodating portion 26 and the protective film 44 are provided in the housing 20. The protector 70 disposed on the terminal surface 25 of the housing 20 covers the external terminal 33.

Figure 13:
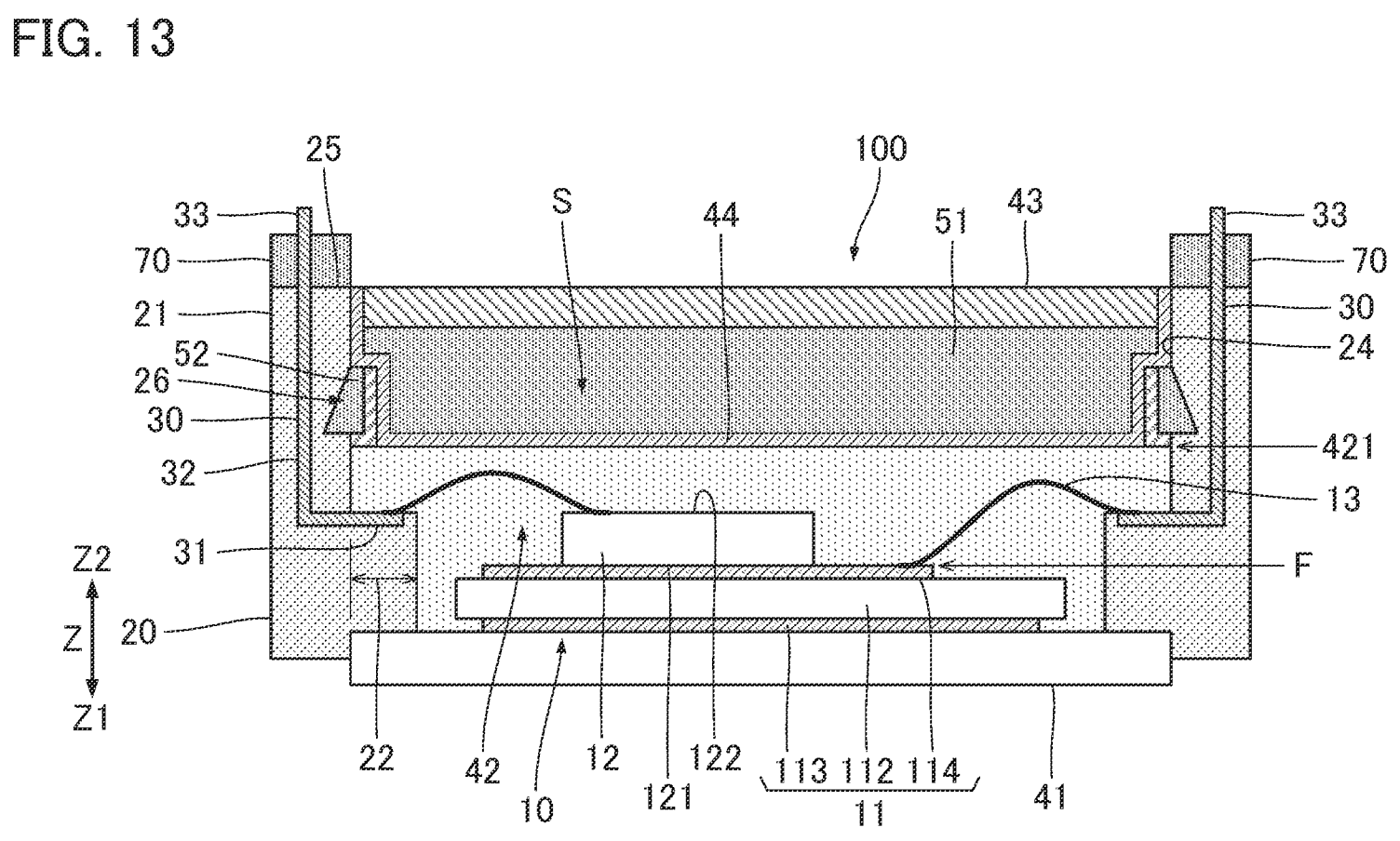

FIG. 13 illustrates an example of a combination of the configurations 1 to 3. Specifically, the adsorbents 51 and 52 are provided in the housing 20, and the protector 70 is disposed on the terminal surface 25 of the housing 20. The following modifications may be applied to the configurations illustrated in FIGS. 10 to 13.

Figure 14:
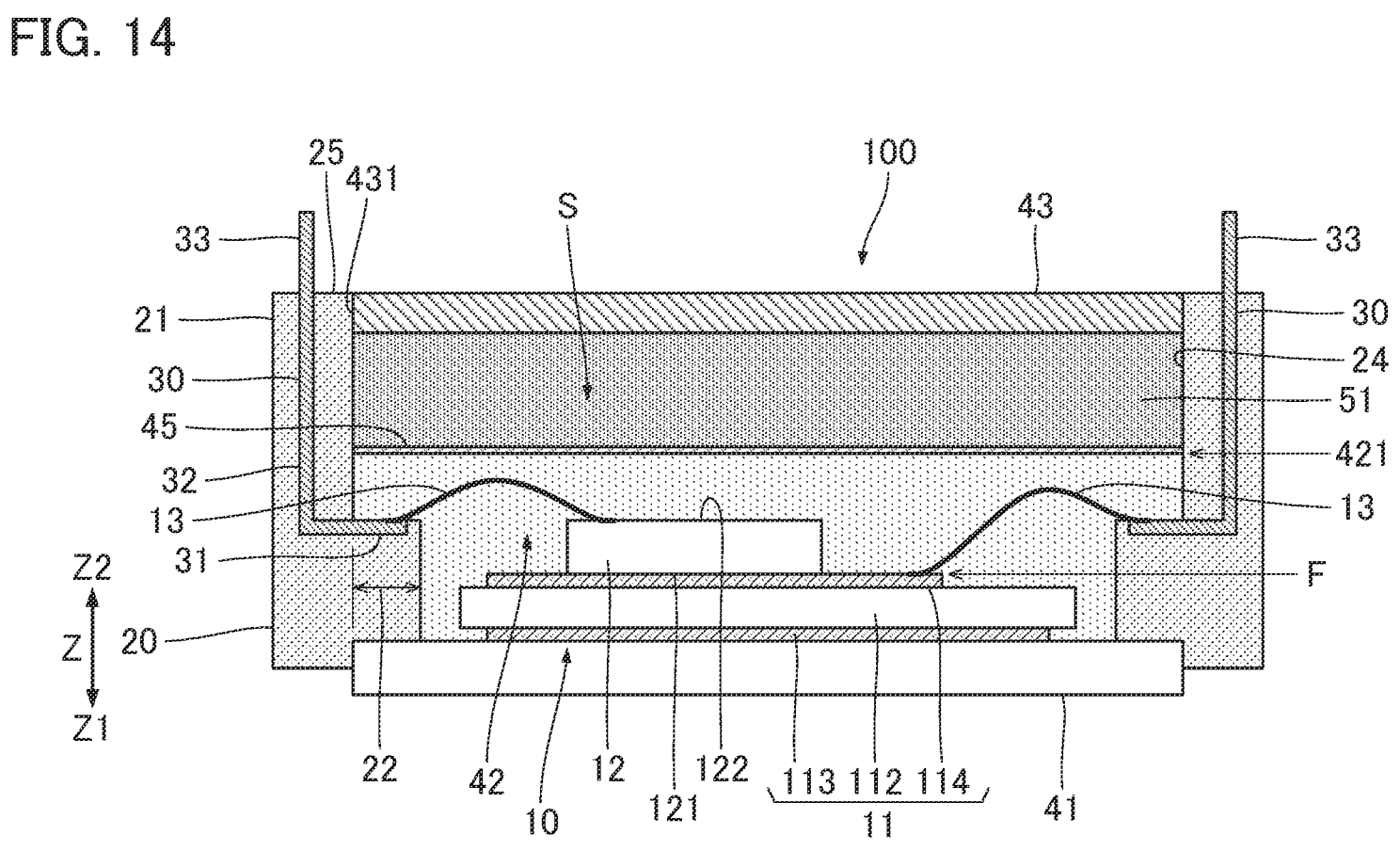

(2) In the first embodiment, another element may be interposed between the sealing material 42 and the adsorbent 51. For example, as illustrated in FIG. 14, a protective film 45 may be disposed between the sealing material 42 and the adsorbent 51. Similarly to the protective film 44, the protective film 45 is formed of a material having low permeability to a penetrating substance. When a substance, such as moisture or a corrosive gas, is adsorbed onto the adsorbent 51, the protective film 45 and the sealing material 42 are pressed in the Z1 direction due to the swelling of the adsorbent 51.

Figure 15:
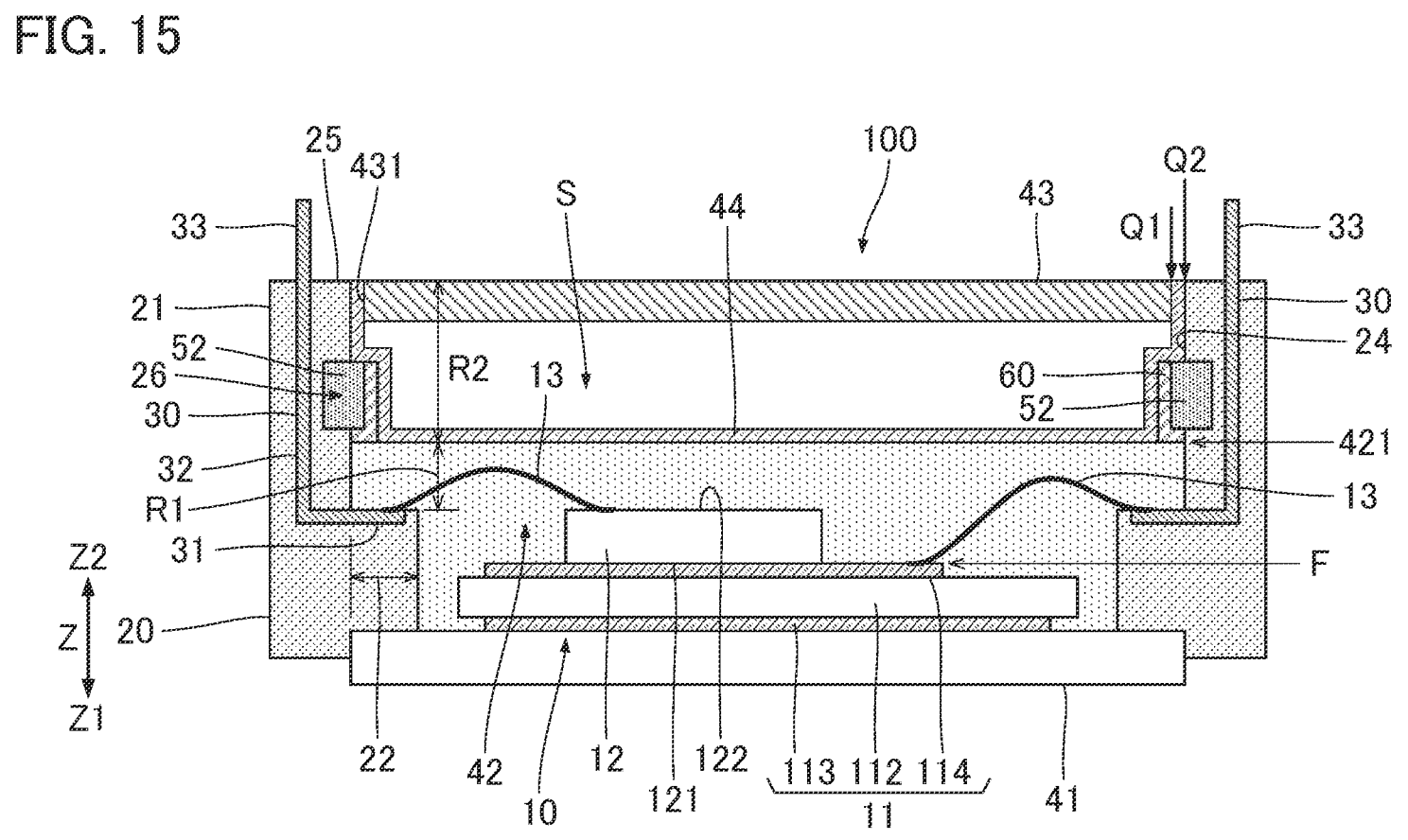

(3) In the second embodiment, an example is given of the triangular accommodating portion 26 in cross-section, but the shape of the accommodating portion 26 is not limited to such an exemplification. For example, as illustrated in FIG. 15, the accommodating portion 26 is quadrangular in cross-section.

Figure 16:
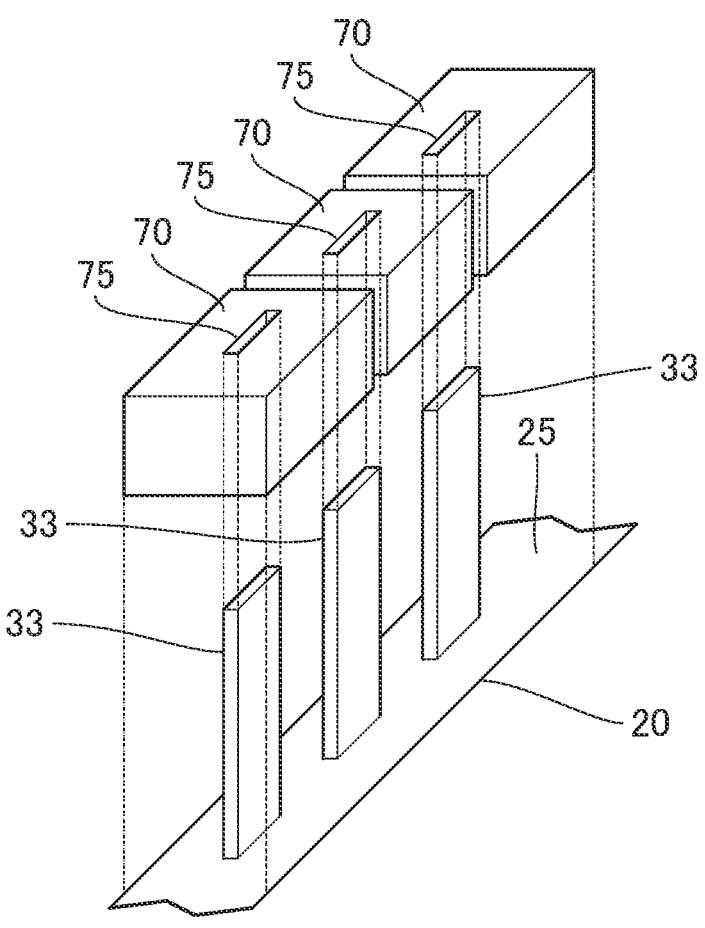
FIG. 16 is an enlarged exploded perspective view of the vicinity of a protector in a modification of the third embodiment.

(4) In the third embodiment, an example is given in which the external terminals 33 are covered with one protector 70. However, as illustrated in FIG. 16, an individual protector 70 may be provided for each external terminal 33. In each protector 70 shown in FIG. 16, as in the third embodiment, the adsorbent 53 is accommodated in the first groove 71, and the adsorbent 54 is accommodated in the second groove 72. In the third embodiment, the second groove 72 surrounds one external terminal 33 in plan view, but a rectangular frame-shaped second groove 72 may be provided so as to surround the external terminals 33 in plan view.

Figure 17:
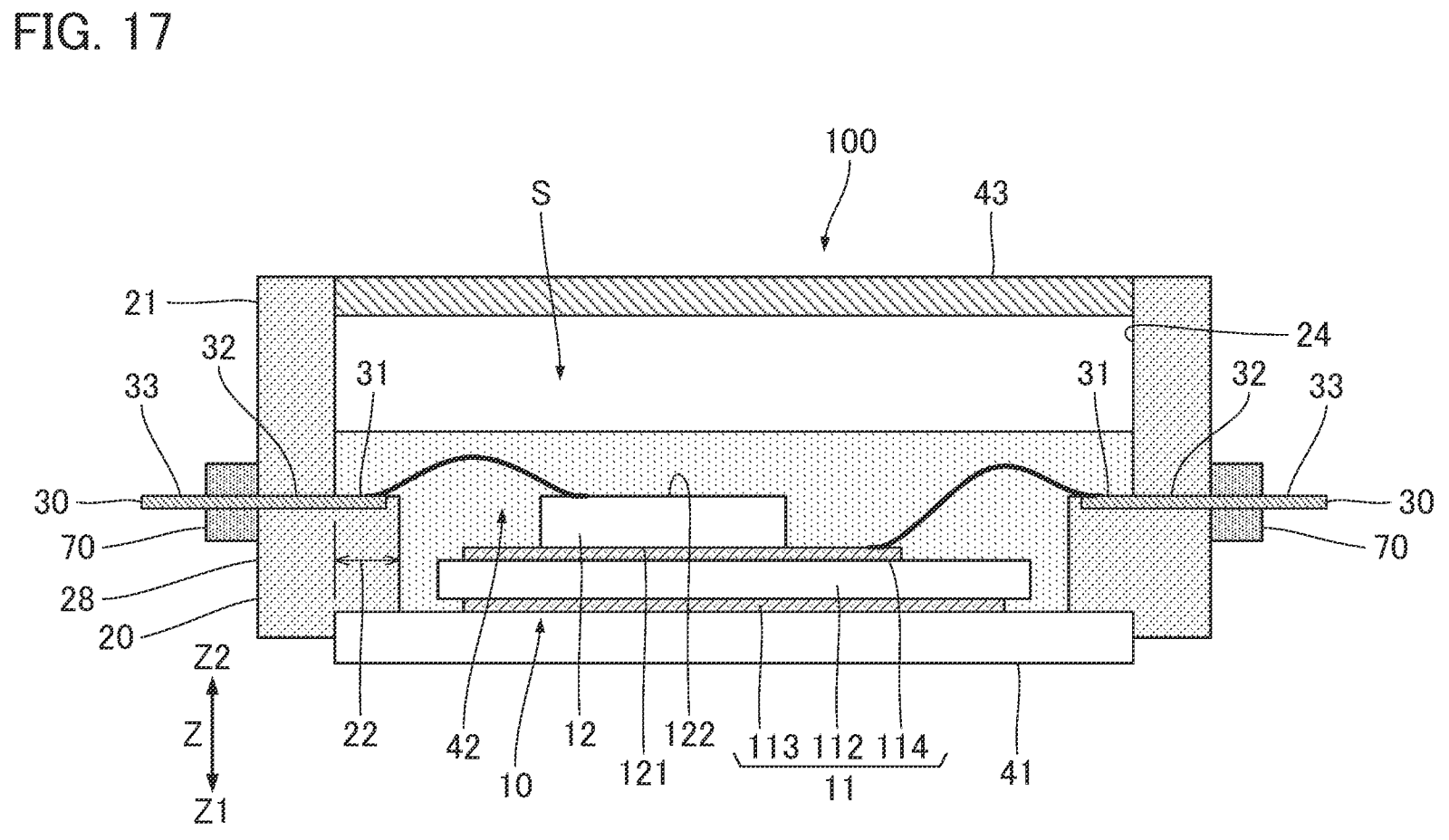

(5) In the third embodiment, the protector 70 is disposed on the upper surface (terminal surface 25) of the housing 20, but the position at which the protector 70 is disposed is not limited to such an example. FIG. 17 shows that the external terminal 33 of the wiring member 30 extends from an outer wall surface 28 of the housing 20 (side wall 21). As shown in FIG. 17, the protector 70 joined to the outer wall surface 28 covers the external terminal 33. Thus, it is sufficient for the protector 70 to be joined to the housing 20, and the position of the protector 70 in the housing 20 is freely selected in this disclosure.

(6) The description "nth" (n is a natural number) in the present application is used only as a formal and convenient sign (label) for distinguishing each element in notation, and does not have any substantive meaning. The position of each element, the order of manufacture, or the like cannot be restrictively interpreted based on the notation "nth".

E: Appendices

The following configurations are derivable from the foregoing embodiments.

Aspect A1

A semiconductor module according to one aspect (Aspect A1) of this disclosure includes: a mounting substrate including a mounting surface; a semiconductor element disposed on the mounting surface; a housing for the semiconductor element; a lid fixed to the housing and facing the mounting surface; an insulating sealing material disposed in a space inside the housing and sealing the semiconductor element; and a first adsorbent disposed between the lid and the insulating sealing material and is swollen by adsorption.

The first embodiment is an example of Aspect A1.

In this aspect, since the first adsorbent is disposed between the lid and the sealing material, a substance (e.g., moisture or corrosive gas) (hereinafter, "penetrating substance") that has entered a gap between the lid and the housing is absorbed by the first adsorbent. That is, the penetrating substance is less likely to reach the mounting substrate and the semiconductor element. As a result, corrosion of the mounting substrate or the semiconductor element due to adhesion of the penetrating substance can be suppressed. In addition, the first adsorbent swells due to adsorption of moisture or the like. Since the sealing material is pressed toward the mounting substrate or the semiconductor element by swelling of the first adsorbent, a gap is less likely to form between the mounting substrate and the sealing material. This leads to suppression of a decrease in insulating properties due to the gap between the mounting substrate and the sealing material.

The first adsorbent is sufficient as long as the sealing material can be pressed by the swollen first adsorbent when moisture or the like is adsorbed onto the first adsorbent. It is not necessary to press the sealing material in a non-adsorbed state. If the sealing material is pressed by swelling of an element between the lid and the sealing material (hereinafter, "specific element") in the semiconductor module when the specific element becomes adsorbed, the specific element is interpreted as a "first adsorbent". Under this interpretation, whether the sealing material is pressed by the specific element, which is in the non-adsorbed state in the process of manufacturing or distributing the semiconductor module, does not affect the interpretation whether the specific element is the "first adsorbent". That is, as long as it can be confirmed that the sealing material is pressed due to swelling of the first adsorbent when the first adsorbent becomes adsorbed, whether the sealing material is pressed by the first adsorbent in the non-adsorbed state (whether there is a state in which the first adsorbent is not swollen or a state in which the sealing material is not pressed) is irrelevant in the determination of the satisfiability of the first adsorbent. For example, moisture is one of objects to be adsorbed that causes swelling of the first adsorbent.

In a specific example (Aspect A2) according to the aspect A1, the insulating sealing material is pressed by swelling of the first adsorbent by adsorption.

As a result, a decrease in insulating properties due to the gap between the mounting substrate and the sealing material is suppressed.

Aspect B1

A semiconductor module according to one aspect (Aspect B1) of this disclosure includes: a mounting substrate; a semiconductor element disposed on the mounting substrate; a housing for the semiconductor element; an insulating sealing material filled in a space inside the housing and sealing the semiconductor element; a second adsorbent accommodated in an accommodating portion provided in an inner wall surface of the housing; and a protective film covering the inner wall surface of the housing and a surface of the insulating sealing material.

The second embodiment is an example of Aspects B1 to B5.

According to this aspect, since the inner wall surface of the housing and the surface of the sealing material are covered with the protective film, adhesion of a penetrating substance to the sealing material is suppressed. In addition, since the second adsorbent is installed in the accommodating portion in the inner wall surface of the housing, a penetrating substance, which has entered a gap between the protective film and the inner wall surface of the housing, is absorbed by the second adsorbent. This can prevent a penetrating substance, which has entered the gap, from reaching the sealing material.

Aspect B2

In a specific example (Aspect B2) according to the aspect B1, the lid has a side surface facing the inner wall surface of the housing, and the protective film includes a portion located between the inner wall surface of the housing and the side surface of the lid.

According to this aspect, since the protective film even exists between the inner wall surface of the housing and the side surface of the lid, a penetrating substance is less likely to enter the interior of the housing from a gap between the inner wall surface of the housing and the side surface of the lid.

Aspect B3

In a specific example (Aspect B3) according to Aspect B1 or B2, the housing is frame-shaped in plan view, and the accommodating portion is continuous over an entire perimeter of the housing on the inner wall surface of the housing.

In this aspect, the accommodating portion that accommodates the second adsorbent is continuous over the entire perimeter of the housing. This can prevent a penetrating substance, which has entered a gap between the inner wall surface of the housing and the protective film, from reaching the sealing material over the entire perimeter of the housing.

Aspect B4

In a specific example (Aspect B4) of any one of Aspects B1 to B3, the semiconductor module further includes a protrusion protruding from a region between (i) the accommodating portion and (ii) a region of the inner wall surface of the housing that comes in contact with the insulating sealing material.

According to this aspect, as compared with a case in which no protrusion is provide on the inner wall surface of the housing, a path length of propagation of a penetrating substance increases. Here, the path length represents a path through which the penetrating substance enters a gap between the protective film and the inner wall surface of the housing propagates until it reaches the sealing material. This can effectively prevent such a penetrating substance from reaching the sealing material. The protrusion may be unitary with the housing. Alternatively, an independent protrusion may be joined to the housing.

Aspect B5

In a specific example (Aspect B5) according to Aspect B4, the protrusion includes: a first portion protruding from the inner wall surface of the housing; and a second portion extending from a distal end of the first portion along the inner wall surface of the housing and facing the accommodating portion.

In this aspect, it is possible to sufficiently secure the path length through which the penetrating substance propagates until it reaches the sealing material. Furthermore, since the second portion faces the accommodating portion, the second adsorbent accommodated in the accommodating portion can be held in the accommodating portion by the second portion.

Aspect C1

A semiconductor module according to one aspect (Aspect C1) of this disclosure includes: a mounting substrate; a semiconductor element disposed on the mounting substrate; a housing that accommodates the semiconductor element; at least one wiring member electrically connected to the semiconductor element; and a protector, in which, the at least one wiring member includes: a coupling portion embedded in the housing, and an external terminal extending from the housing to a space outside the housing, the protector is a single component joined to the housing, and the external terminal is covered with the protector.

The third embodiment is an example of Aspects C1 to C7.

In this aspect, since a gap between the external terminal and the housing is covered with the protector, a penetrating substance is less likely to enter the internal space of the housing from the gap. As a result, it is possible to suppress risk of a failure such as corrosion caused by adhesion of a penetrating substance.

In addition, since the protector is a single component, it is easy to dispose the protector, as compared with a case (Comparative Example) in which the protector is formed by applying and curing a resin material to the housing.

In the Comparative Example, in some cases, the protector may be peeled off from the housing. According to this aspect, since the protector is a single component, the protector less likely to peel off from the housing, as compared with the Comparative Example.

The "electrical connection" to the semiconductor element includes not only a case in which an entity is directly joined to the semiconductor element but also a case in which an entity is indirectly conducted to the semiconductor element via another conductor. Thus, the concept of "electrical connection" includes, in addition to a case in which the wiring member is directly joined to the semiconductor element, a case in which the wiring member and the semiconductor element are joined to the same conductor pattern.

The "space inside the housing (internal space)" is a space in which the semiconductor element is present (e.g., a space surrounded by the housing). The "space outside the housing" is a space other than the "space inside the housing". That is, the "external terminal" is a connection terminal extending to a space other than the space inside the housing. For example, the "external terminal" corresponds to a connection terminal extending from an upper surface of a housing to an upper side of the housing. Alternatively, it corresponds to a connection terminal extending from an outer wall surface of the housing to an outside the housing.

Aspect C2

In a specific example (Aspect C2) according to Aspect C1, the semiconductor module further includes a third adsorbent, in which, the protector further includes an inner surface facing the external terminal, and a first groove is provided in the inner surface, and the third adsorbent is accommodated in the first groove.

In this aspect, a penetrating substance that has entered a space between the protector and the external terminal is absorbed by the third adsorbent. This can effectively prevent the penetrating substance from reaching the internal space of the housing.

Aspect C3

In a specific example (Aspect C3) according to Aspect C2, the first groove surrounds the external terminal over an entire perimeter on the inner surface of the protector that faces the external terminal.

In this aspect, since the first groove accommodating the third adsorbent surrounds the entire perimeter of the external terminal, the entry of a penetrating substance is remarkably reduced, as compared with a case in which the first groove surrounds only a part of the external terminal.

Aspect C4

In a specific example (Aspect C4) according to any one of Aspects C1 to C3, the semiconductor module further includes a fourth adsorbent, in which, the protector includes an inner surface facing the housing, and a second groove is provided in the inner surface, and the fourth adsorbent is accommodated in the second groove.

In this aspect, a penetrating substance that has entered a gap between the protector and the housing is absorbed by the fourth adsorbent. This can effectively prevent the penetrating substance from reaching the internal space inside the housing.

Aspect C5

In a specific example (Aspect C5) according to Aspect C4, the second groove surrounds the external terminal over an entire perimeter on the inner surface of the protector that faces the housing.

In this aspect, since the second groove accommodating the fourth adsorbent surrounds the entire perimeter of the external terminal, the entry of a penetrating substance is remarkably reduced, as compared with a case in which the second groove surrounds only a part of the external terminal.

Aspect C6

In a specific example (Aspect C6) of any one of Aspects C1 to C5, the at least one wiring member includes a plurality of wiring members, the protector is a unitary member covering a plurality of external terminals, and each of the plurality of external terminals is included in a corresponding wiring member of the plurality of wiring members and extends from the housing to the space outside the housing.

In this aspect, the external terminals of the respective wiring members are covered with the integrated protector. As a result, the configuration can be simplified, as compared with a case in which the external terminal of each of the wiring members is covered with the individual protector. For example, the number of parts in the semiconductor module is reduced, and the manufacturing process is simplified.

Aspect C7

In a specific example (Aspect C7) according to any one of Aspects C1 to C6, the protector and the housing are formed of the same material.

In this aspect, the thermal stress caused by the difference in linear expansion coefficient between the protector and the housing is reduced, as compared with a case in which the protector and the housing are formed of different materials. As a result, a gap is less likely to form between the protector and the housing. This makes it possible to suppress entry of a penetrating substance through the gap.

Aspect D

In any one of the aspects, the insulating sealing material is a gel material.

Since the sealing material is a gel insulating material, it is possible to reduce stress acting on the semiconductor element or the mounting substrate from the sealing material. While such an advantages can be expected, the gel insulating material tends to easily permeate the penetrating substance. According to this disclosure, the first adsorbent installed between the lid and the sealing material prevents a penetrating substance from reaching the sealing material. Such a configuration described in this disclosure is particularly effective in a case which the sealing material is made of a gel insulating material.

DESCRIPTION OF REFERENCES SIGNS 100A, 100B, 100C: semiconductor module, 10: semiconductor unit, 11: mounting substrate, 112: insulating substrate, 113: metal layer, 114: conductor pattern, 12: semiconductor element, 121, 122: electrode, 13: wire, 20: housing, 21: side wall, 22: projecting portion, 24: inner wall surface, 25: terminal surface, 26: accommodating portion, 261: first surface, 262: second surface, 28: outer wall surface, 30: wiring member, 31: internal terminal, 32: coupling portion, 33: external terminal, 41: heat sink, 42: sealing material, 421: surface of sealing material, 43: lid, 431: side surface of lid, 44, 45: protective film, 51, 52, 53, 54: adsorbent, 60: protrusion, 61: first portion, 62: second portion, 70: protector, 71: first groove, 72: second groove,

75: insertion opening, 76: inner perimeter surface, 77: joint surface, f: mounting surface, S: internal space, Q0, Q1, Q2, Q3, Q4: penetrating substance.

What is claimed is:

1. A semiconductor module comprising:
a housing surrounding a space in the housing;
a mounting substrate in the space, and including a mounting surface;
a semiconductor element in the space, and on the mounting surface;
a lid faced toward the mounting surface, and fixed to the housing such that the space is closed by the lid;
an insulating sealing material in the space, and sealing the semiconductor element; and
an adsorbent in the space, and between the lid and the insulating sealing material, the adsorbent configured to swell by adsorption such that, with the adsorbent swollen by adsorption, the adsorbent presses the insulating sealing material to thereby prevent formation of a gap between the mounting substrate and the insulating sealing material.

2. The semiconductor module of claim 1, wherein the insulating sealing material includes a gel material.

3. The semiconductor module of claim 1, wherein the adsorbent is a first adsorbent, and the semiconductor module further includes:
a second adsorbent accommodated in an accommodating portion in an inner wall surface of the housing that faces the space,
a protective film that covers:
the inner wall surface of the housing, and
a surface of the insulating sealing material that faces the space, and
the second adsorbent is configured to adsorb a penetrating substance such that, with the penetrating substance entered in a gap between the protective film and the inner wall surface, adhesion of the penetrating substance to the insulating sealing material is suppressed by the second adsorbent.

4. The semiconductor module of claim 3, wherein the lid includes a side surface that faces the inner wall surface, and
the protective film includes a portion located between the inner wall surface and the side surface.

5. The semiconductor module of claim 3, wherein the accommodating portion is continuous over an entire perimeter of the inner wall surface of the housing.

6. The semiconductor module of claim 3, further comprising:
a protrusion that protrudes from the inner wall surface in a region between the accommodating portion and the insulating sealing material.

7. The semiconductor module of claim 6, wherein the protrusion includes:
a first portion that protrudes from the inner wall surface; and
a second portion that extends from a distal end of the first portion along the inner wall surface of the housing, and faces the accommodating portion.

8. The semiconductor module of claim 1, further comprising:
at least one wiring member electrically connected to the semiconductor element, and including:
a coupling portion embedded in the housing, and
an external terminal extended from an external surface of the housing to an outside of the housing; and a protector joined to the external surface and the external terminal such that a gap between the external surface and the external terminal is covered by the protector, the protector being a single component.

9. The semiconductor module of claim 8,
wherein the adsorbent is a first adsorbent, and
the semiconductor module further includes:
a second adsorbent,
wherein the protector includes:
a surface that faces the external terminal, and
a groove in the surface, and
the second adsorbent is accommodated in the groove.

10. The semiconductor module of claim 9,
wherein the groove surrounds the external terminal over an entire perimeter of the surface.

11. The semiconductor module of claim 8, wherein
the protector includes:
a surface that faces the external surface of the housing, and
a groove in the surface, and
a second adsorbent is accommodated in the groove.

12. The semiconductor module of claim 11,
wherein the groove surrounds the external terminal over an entire perimeter of the external terminal.

13. The semiconductor module of claim 8, wherein
the at least one wiring member is among a plurality of wiring members,
the external terminal is among a plurality of external terminals respectively corresponding to the plurality of wiring members,
the protector is a unitary member that covers the plurality of external terminals, and
each external terminal of the plurality of external terminals is extended from the housing to the outside of the housing.

14. The semiconductor module of claim 8,
wherein the protector and the housing include a same material.

15. A semiconductor module, comprising:
a housing surrounding a space in the housing;
a mounting substrate in the space, and including a mounting surface;
a semiconductor element in the space, and on the mounting surface;
a lid faced toward the mounting surface, and fixed to the housing such that the space is closed by the lid;
an insulating sealing material in the space, and sealing the semiconductor element; and
an adsorbent accommodated in an accommodating portion in an inner wall surface of the housing that faces the space, and
a protective film that covers:
the inner wall surface of the housing, and
a surface of the insulating sealing material that faces the space,
wherein the adsorbent is configured to adsorb a penetrating substance such that, with the penetrating substance entered in a gap between the protective film and the inner wall surface, adhesion of the penetrating substance to the insulating sealing material is suppressed by the adsorbent.

16. A semiconductor module, comprising:
a housing surrounding a space in the housing;
a mounting substrate in the space, and including a mounting surface;
a semiconductor element in the space, and on the mounting surface;

a lid faced toward the mounting surface, and fixed to the
housing such that the space is closed by the lid;
an insulating sealing material in the space, and sealing the
semiconductor element; and
at least one wiring member electrically connected to the
semiconductor element, and including:
a coupling portion embedded in the housing, and
an external terminal extended from an external surface
of the housing to an outside of the housing; and
a protector joined to the external surface and the external
terminal such that a gap between the external surface
and the external terminal is covered by the protector,
the protector being a single component.

\*    \*    \*    \*    \*